United States Patent
Grossman et al.

(10) Patent No.: US 12,284,756 B2
(45) Date of Patent: Apr. 22, 2025

(54) TRANSPARENT COMPOSITE NANOWIRE ELECTRODES

(71) Applicant: Massachusetts Institute of Technology, Cambridge, MA (US)

(72) Inventors: Jeffrey C. Grossman, Brookline, MA (US); Woo Hyun Chae, Cambridge, MA (US); Thomas Andre Francois Sannicolo, Grenoble (FR)

(73) Assignee: Massachusetts Institute of Technology, Cambridge, MA (US)

( * ) Notice: Subject to any disclaimer, the term of this patent is extended or adjusted under 35 U.S.C. 154(b) by 214 days.

(21) Appl. No.: 17/775,571

(22) PCT Filed: Nov. 18, 2020

(86) PCT No.: PCT/US2020/060957
§ 371 (c)(1),
(2) Date: May 9, 2022

(87) PCT Pub. No.: WO2021/101931
PCT Pub. Date: May 27, 2021

(65) Prior Publication Data
US 2022/0377887 A1    Nov. 24, 2022

Related U.S. Application Data

(60) Provisional application No. 62/937,312, filed on Nov. 19, 2019.

(51) Int. Cl.
*H05K 1/09*  (2006.01)
*H10K 30/82*  (2023.01)
*G06F 3/041*  (2006.01)

(52) U.S. Cl.
CPC ............. *H05K 1/097* (2013.01); *H10K 30/82* (2023.02); *G06F 3/041* (2013.01); *H05K 2201/0108* (2013.01); *H05K 2201/026* (2013.01); *H05K 2203/1131* (2013.01)

(58) Field of Classification Search
CPC .................. H05K 1/097; H05K 2201/026
See application file for complete search history.

(56) References Cited

U.S. PATENT DOCUMENTS

| | | | |
|---|---|---|---|
| 2003/0094666 A1* | 5/2003 | Clayton | H01L 23/49827 257/459 |
| 2011/0094651 A1 | 4/2011 | Kuriki | |
| 2011/0100532 A1 | 5/2011 | Lee et al. | |

(Continued)

OTHER PUBLICATIONS

PCT/US2020/060957, Feb. 10, 2021, International Search Report and Written Opinion.

(Continued)

*Primary Examiner* — Jeremy C Norris
(74) *Attorney, Agent, or Firm* — Wolf, Greenfield & Sacks, P.C.

(57) ABSTRACT

Composite electrodes and their methods of manufacture are disclosed. In one embodiment, an electrode may include a first layer including first particles, a second layer including conductive nanowires, and a third layer comprising second particles. The second layer may be disposed between and in electrical contact with the first layer and the third layer. The composite electrode may be substantially transparent in some embodiments.

26 Claims, 15 Drawing Sheets

(56) References Cited

U.S. PATENT DOCUMENTS

| | | | |
|---|---|---|---|
| 2014/0290987 A1 | 10/2014 | Yang et al. | |
| 2015/0037517 A1 | 2/2015 | Buriak et al. | |
| 2015/0310963 A1* | 10/2015 | Markham | H05K 3/1258 427/118 |
| 2016/0128182 A1* | 5/2016 | Park | B32B 27/281 156/60 |

OTHER PUBLICATIONS

International Search Report and Written Opinion for PCT/US2020/060957 mailed Feb. 10, 2021.
Aliprandi et al., Hybrid Copper-Nanowire-Reduced-Graphene-Oxide Coatings: A "Green Solution" Toward Highly Transparent, Highly Conductive, and Flexible Electrodes for (Opto)Electronics. Adv. Mater. 2017, 29 (41), 1703225.
Alotaibi et al., Silver Nanowires with Pristine Graphene Oxidation Barriers for Stable and High Performance Transparent Conductive Films. ACS Appl. Nano Mater. 2018, 1 (5), 2249-2260.
Hecht et al., Emerging Transparent Electrodes Based on Thin Films of Carbon Nanotubes, Graphene, and Metallic Nanostructures. Adv. Mater. 2011, 23 (13), 1482-1513.
Kumar et al., A Flexible Sandwich Graphene/Silver Nanowires/Graphene Thin Film for High-Performance Electromagnetic Interference Shielding. RSC Adv. 2016, 6 (103), 101283-101287.
Lai et al., One-Step Process for High-Performance, Adhesive, Flexible Transparent Conductive Films Based on p-Type Reduced Graphene Oxides and Silver Nanowires. ACS Appl. Mater. Interfaces 2015, 7 (33), 18553-18559.
Liang et al., Silver Nanowire Percolation Network Soldered with Graphene Oxide at Room Temperature and Its Application for Fully Stretchable Polymer Light-Emitting Diodes. ACS Nano 2014, 8 (2), 1590-1600.
Moon et al., 2D Graphene Oxide Nanosheets as an Adhesive Over-Coating Layer for Flexible Transparent Conductive Electrodes. Sci. Rep. 2013, 3 (1), 1112.
Wu et al., Rapid Self-Assembly of Ultrathin Graphene Oxide Film and Application to Silver Nanowire Flexible Transparent Electrodes. RSC Adv. 2016, 6 (19), 15838-15845.
Ahn et al., Improved Thermal Oxidation Stability of Solution-Processable Silver Nanowire Transparent Electrode by Reduced Graphene Oxide. ACS Appl. Mater. Interfaces 2012, 4 (12), 6410-6414.
Hasan et al., Sacrificial Layer Electrophoretic Deposition of Free-Standing Multilayered Nanoparticle Films. Chem. Commun. 2009, 0 (25), 3723.
Hwang et al., Effect of RGO Deposition on Chemical and Mechanical Reliability of Ag Nanowire Flexible Transparent Electrode. RSC Adv. 2016, 6 (71), 67389-67395.
Ricciardulli et al., Hybrid Silver Nanowire and Graphene-Based Solution-Processed Transparent Electrode for Organic Optoelectronics. Adv. Funct. Mater. 2018, 28 (14), 1706010.
Zhong et al., Simultaneously Armored and Active Graphene for Transparent and Flexible Supercapacitors. Adv. Funct. Mater. 2018, 1801998.

* cited by examiner

TRANSPARENT COMPOSITE NANOWIRE ELECTRODES

CROSS-REFERENCE TO RELATED APPLICATIONS

This application is a national stage filing under 35 U.S.C. § 371 of International application serial number PCT/US2020/060957, filed Nov. 18, 2020, which claims the benefit under 35 U.S.C. § 119(e) of U.S. provisional application Ser. No. 62/937,312, filed Nov. 19, 2019, the disclosure of each of which are incorporated herein by reference in their entirety.

FIELD

Disclosed embodiments are related to transparent composite nanowire electrodes.

BACKGROUND

Transparent electrodes are used in various devices including solar cells, displays, touch screens, and transparent heaters. In order to meet the growing demands for these devices, there has been a persistent interest in developing a more transparent, conductive, flexible, and long-lasting layer that is also cost-effective. Although the current industry standard transparent electrode material is indium tin oxide (ITO) due to its superior optical transmittance (90% at 550 nm) and low sheet resistance (20 Ω/sq), the limited supply of indium, high cost of sputtering, and the brittle nature of ITO inhibits its widespread adoption into the next-generation flexible and stretchable electronics.

Due to the drawbacks associated with ITO, random networks of solution synthesized metal nanowires (MNW) such as those made of silver nanowire (AgNW) are promising as alternative transparent electrodes. AgNW networks are compatible with scalable deposition techniques, mechanically robust, and demonstrate sheet resistances as low as 10 Ω/sq and transparency (at 550 nm) between 80% and 90% without substrate, which meets the needs for most target applications. Yet, despite the significant benefits, and largely due to their high surface-to-volume ratio, AgNW networks (and more broadly any MNW network) are not chemically, thermally, or electrically stabile. Chemical degradation of AgNW occurs readily even under ambient conditions. For example, it is well-known that silver undergoes spontaneous sulfidation to form silver sulfide ($Ag_2S$) particles by reacting with atmospheric species such as carbonyl sulfide (OCS). Even when integrated into devices, the long-term chemical stability of MNW-based electrodes can be problematic. For instance, AgNW was observed to degrade when in contact with acidic PEDOT:PSS, a widely used conductive polymer mixture for charge transport layers in organic solar cells. Also, MNWs undergo spheroidization by Rayleigh instability under high temperature induced by Joule heating. This causes the MNW network to lose its percolative nature in the short term at high applied voltages or in the long term at low applied voltages. The combination of such instabilities is the most significant technological barrier to the widespread application of MNW networks as reliable TE.

SUMMARY

In one embodiment, an electrode includes a first layer comprising first particles, a second layer comprising conductive nanowires, and a third layer comprising second particles. The second layer is disposed between and in electrical contact with the first layer and the third layer.

In another embodiment, a method of forming an electrode includes: depositing a first layer comprising first particles; depositing a second layer comprising conductive nanowires on the first layer; and depositing a third layer comprising second particles on the second layer.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings.

DETAILED DESCRIPTION

Figure 1:
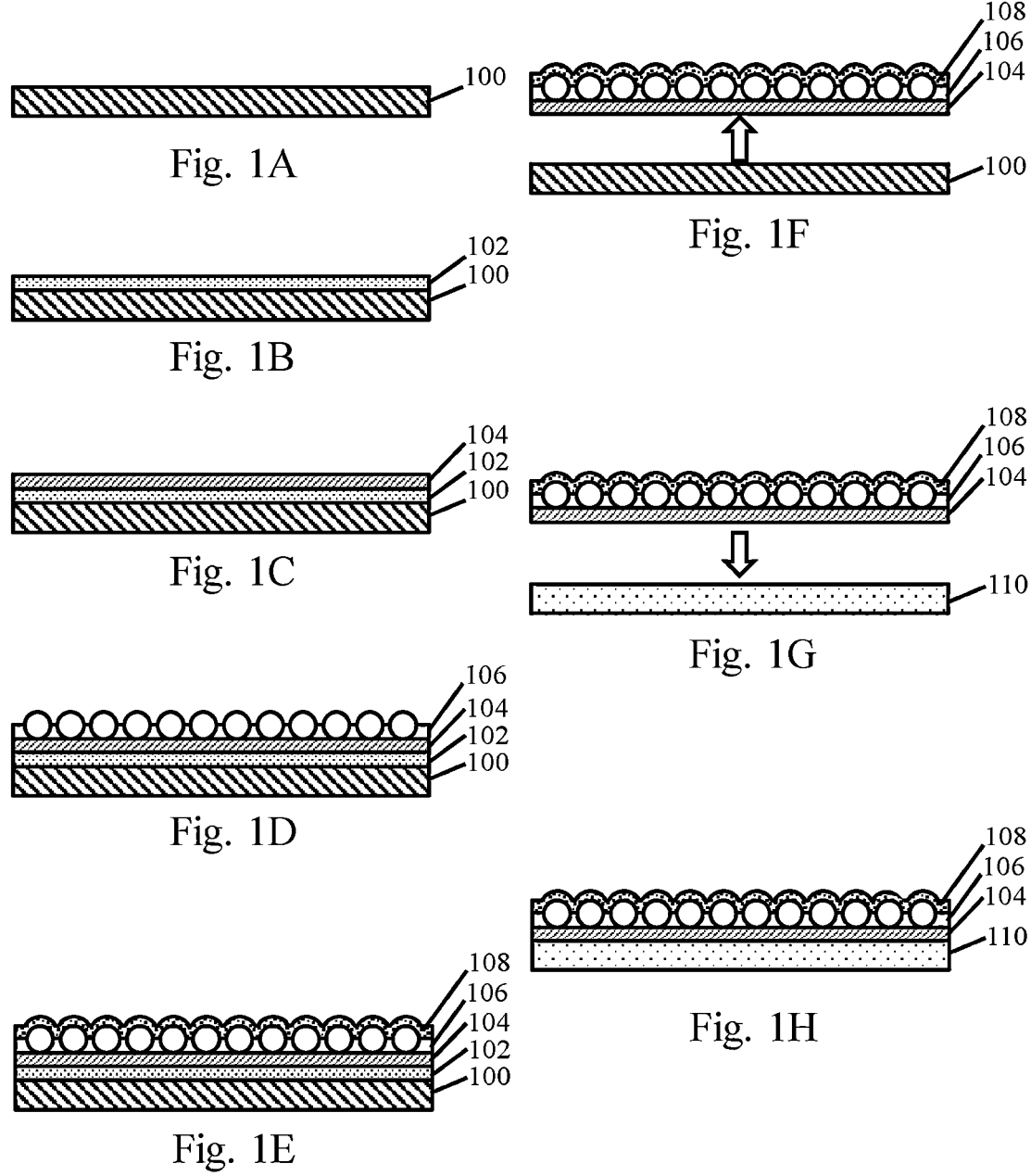
FIGS. 1A-1H illustrate one embodiment of a method for the formation and transfer of a transparent electrode.

Prior studies have attempted to address the drawbacks associated with conductive nanowires. This has included hybridizing conductive nanowires with various other materials. For example, conductive nanowire electrodes have been coated with chemical vapor deposited graphene; conformal transparent metal oxide coatings have been atomic layer deposited onto metal nanowire electrodes; and other efforts have been undertaken to create stable transparent electrodes using conductive nanowires. Other efforts have involved the creation of composites of conductive nanowires with solution-processible graphene oxide (GO) or reduced graphene oxide (rGO). However, all of these techniques suffer from various drawbacks which include combinations of substrate geometry constraints, elevated processing temperatures, the use of vacuums or high pressure, deposition system reliability issues, increased cost, and/or other considerations.

In view of the above, the Inventors have recognized the benefits associated with a simple and reliable method for creating an electrode composite with conductive nanowires forming one layer and layers of particles with sufficient conductivity deposited on opposing sides of the conductive nanowire layer to permit the formation of an electrode with a desired sheet resistance. Specifically, solution based deposition techniques may be used to deposit two layers of particles with a layer of conductive nanowires disposed there between and in electrical contact with each of the layers. Such an electrode formation method may be both cost-effective and flexible in regards to forming various electrodes with different shapes and for different applications. In the noted embodiment, a thickness of each layer and a conductivity of the particles of each of the layers of particles surrounding the metal nanowire layer may be selected to provide the desired sheet resistance of the resulting composite electrode.

In some embodiments, processing of a composite electrode may be facilitated by the inclusion of a release layer between a substrate and a first layer of the composite electrode. The release layer may correspond to any appropriate material capable of being dissolved by a solvent compatible with the composite electrodes described herein. For example, appropriate types of materials for the release layer may include cellulose acetate (CA), poly(lactic-co-glycolic acid) (PLGA) and other appropriate materials that are not dissolvable by the carrier solvent used during formation of the first layer. The release layer may also be applied using any appropriate deposition technique, including, but not limited to, spin coating, spray coating, doctor blade coating, dip coating, and/or any other appropriate application technique capable of applying the release layer to the underlying substrate.

In some embodiments wherein a release layer is included between a substrate and a first layer of a composite electrode, the release layer may be removed during or after formation of the composite electrode. The release layer may be removed by any appropriate method. For example, after formation of every layer of the composite electrode, the substrate may be immersed in a solvent compatible with the electrode materials for a predetermined amount of time sufficient to dissolve the release layer. Appropriate solvents may include but are not limited to, acetone, de-ionized water, and/or any other appropriate solvent. Removal of the release layer may also be accomplished using photodegradation of the release layer where incident light within a desired range of wavelengths may cleave bonds within the release layer. Once the release layer is dissolved, the composite electrode may be detached from the substrate. In some embodiments, the composite electrode may be detached using a water based lift off method, mechanical detachment and/or initiation (e.g. initiating detachment at a corner or edge of the electrode), combinations of the forgoing, and/or any other appropriate method to detach the composite electrode from the substrate.

In some embodiments, a layer may be formed through electrophoretic deposition (EPD). In some embodiments, electrophoretic deposition of a layer may constitute immersing a surface of a substrate or a surface of a coated substrate in a solution including a suspension of particles. The solution including the suspension of particles may be an aqueous solution. However, embodiments where the solution is non-aqueous and instead comprises solvents such as isopropyl alcohol, ethanol, and/or hexane are also contemplated. In either case, the particles may be conductive and charge-stable within the solution during the deposition process. Further, the particles may be charged such that a voltage potential will bias them towards the surface of the substrate or the surface of the coated substrate. Accordingly, when a deposition voltage potential is applied to the surface of the substrate or the surface of the coated substrate, the conductive particles may be deposited onto a layered structure including a release layer via an electrophoretic deposition process to form a layer. In some embodiments, the electrophoretic layer is disposed directly onto a release layer. However, embodiments in which other layers are present between the electrophoretic layer and the release layer are also contemplated.

Appropriate types of materials that may be applied in this fashion include, but are not limited to, reduced graphene oxide particles, metal oxides, metal nanoparticles functionalized with charged ligands, and/or any other appropriate types of charged particles capable of being applied using an electrophoretic deposition process. In some embodiments, the particles may also be at least partially transparent in a desired range of wavelengths, such as in the visible spectrum (e.g. 380 to 740 nanometers). Exemplary particles and particle properties are disclosed below.

The electrophoretic deposition may be continued until a layer with a thickness that is greater than or equal to at least several conductive particle thicknesses has been deposited. In some embodiments, an electrophoretically deposited layer may be viewed as being substantially continuous and may be substantially impermeable to a surrounding atmosphere such as atmospheric air. Further, an average thickness and material of the electrophoretically deposited layer may be selected to provide a desired overall electrode sheet resistance. For example, the average thickness of the electrophoretically deposited layer may be selected to be greater than 10 nm, greater than 15 nm, greater than 25 nm, or greater, and/or less than 200 nm, less than 100 nm, less than 50 nm, or less. In some embodiments, the average thickness of the electrophoretically deposited layer may include a combination of any of the above-mentioned ranges. For example, in some embodiments, the average thickness of the electrophoretically deposited layer may be between or equal to 10 nm and 200 nm. Of course, it should be understood that average thicknesses other than those noted above may be used as the disclosure is not so limited.

In some embodiments, the particles used for electrophoretic deposition may have a concentration in solution greater than 0.01 mg/mL, greater than 0.03 mg/mL, greater than 0.08 mg/mL, or greater, and/or less than 1.0 mg/mL, less than 0.75 mg/mL, less than 0.45 mg/mL, or less. In some embodiments, the concentration of particles used to form layers of an electrode may include combinations of any of the above-mentioned ranges. For example, in some embodiments, the concentration of particles may be between or equal to 0.01 mg/mL and 1.0 mg/mL as well as between or equal to 0.08 mg/mL and 0.45 mg/mL. Of course, it should be understood that concentrations other than those noted above may be used as the disclosure is not so limited.

In some embodiments, a layer may be formed through dip deposition. Dip deposition of a layer may constitute immersing a surface of a substrate, a surface of a coated substrate, or a surface of a partially formed electrode in a solution with a suspension of particles. The solution including the suspension of particles may be an aqueous solution or a non-aqueous solution comprising solvents such as isopropyl alcohol, ethanol, and/or hexane. The particles within the solution may deposit onto the surface of the substrate, the surface of the coated substrate, or the surface of the partially-formed electrode to form a layer.

Appropriate types of materials that may be applied using dip coating may include, but are not limited to, graphene oxide and reduced graphene oxide particles, MXene (2 dimensional transition metal carbides/nitrides); metal oxide particles (e.g. zinc oxide, tin oxide, and other appropriate metal oxides); metal nanoparticles (e.g. gold, silver, platinum, and other appropriate metal nanoparticles). In some embodiments, the particles may also be at least partially transparent in a desired range of wavelengths including, for example, the visible spectrum. Exemplary particles and particle properties are disclosed below.

In some embodiments, a dip deposited layer may be viewed as being substantially continuous. Further, an average thickness and material of the dip deposited layer may be selected to provide a desired overall electrode sheet resistance. For example, in some instances an average thickness of the dip deposited layer may be greater than or equal to one times a thickness of the particles used to form the dip deposited layer, greater than or equal to two times a thickness of the particles used to form the dip deposited layer, greater than or equal to three times a thickness of the particles used to form the dip deposited layer or greater, and/or less than or equal to five times a thickness of the particles used to form the dip deposited layer, less than or equal to four times a thickness of the particles used to form the dip deposited layer, less than or equal to three times a thickness of the particles used to form the dip deposited layer, or less. In some embodiments, the average thickness of the dip deposited layer may be any appropriate combination of the above-mentioned ranges. For example, in some embodiments, the average thickness of the electrophoretically deposited layer may be between or equal to one times the thickness of the particles used to form the dip deposited layer and five times the thickness of the particles used to form the dip deposited layer. However, instances in which a thicker layer is formed are also contemplated, as the disclosure is not so limited.

In some embodiments, the particles used for dip deposition may have a concentration in solution greater than 0.5 mg/mL, greater than 1 mg/mL, greater than 1.5 mg/mL, or greater, and/or less than 5 mg/mL, less than 4 mg/mL, less than 3 mg/mL, or less. In some embodiments, the concentration of particles used to form layers of an electrode may be any appropriate combination of the above-mentioned ranges. For example, in some embodiments, the concentration of particles may be between or equal to 1 mg/mL and 4 mg/mL. Of course, it should be understood that concentrations other than those noted above may be used as the disclosure is not so limited.

A conductive nanowire layer may be formed by any appropriate formation method, including but not limited to spin coating, spray coating, doctor blade coating, drop casting, slot die coating, Mayer rod coating, and dip coating. In exemplary embodiments, such formation methods may be chosen through consideration of aspects such as desired layer thickness, preservation of previously-formed layers, wettability of previously-formed layers, electrode sheet resistance, nanowire corrosion, stability of a release layer, and device transparency, although other requirements may also be considered.

In some embodiments, a conductive nanowire layer may be formed by spin coating. In some embodiments, spin coating may constitute immersing a surface of a substrate, a surface of a coated substrate, or a surface of a partially-formed electrode in a solution including a suspension of conductive nanowires, and subsequently spinning the substrate, the coated substrate or the partially-formed electrode to form the conductive nanowire layer on the surface. Exemplary nanowire properties are described below. The solution including the suspension of nanowires may be an aqueous solution. However, embodiments where the solution is non-aqueous and instead comprises solvents such as isopropyl alcohol, ethanol, and/or hexane are also contemplated. For a given type of conductive nanowires, the density of the conductive nanowires is primarily responsible for the sheet resistance of the conductive electrode and can be tuned by changing the concentration of conductive nanowire solution and spin speed.

Appropriate types of conductive nanowire materials that may be applied in this fashion include, but are not limited to: metal nanowires such as gold nanowires, silver nanowires, copper nanowires, other appropriate metal nanowires; carbon nanotubes, and/or any other appropriate conductive nanowires that are compatible with the processes and materials described herein. Exemplary nanowires and nanowire properties are disclosed below.

Depending on the specific method used to form the conductive nanowire layer, concentrations of the nanowires within a solution, such as an aqueous solution or a non-aqueous solution comprising a solvent such as isopropyl alcohol, may be greater than 1 mg/mL, greater than 3 mg/mL, greater than 5 mg/mL, or greater, and/or less than 10 mg/mL, less than 8 mg/mL, less than 5 mg/mL, less than 3 mg/mL, or less. For example, in some embodiments, combinations of any of the above-noted ranges may be used. For instance, the concentration of nanowires may be between or equal to 2 mg/mL and 5 mg/mL. Of course, it should be understood that concentrations other than those noted above may be used as the disclosure is not so limited.

As used herein, areal mass density (AMD) of a nanowire layer refers to the mass of the nanowires per unit area. The AMD of a nanowire layer may be related to the layer's transparency and sheet resistance. AMD may be measured according to any appropriate technique. For example, the AMD of an exemplary nanowire layer may be measured by imaging the layer by SEM, and using image analysis software to estimate the mass-density of the layer. In some embodiments, nanowire layers may have an AMD of greater than or equal to 1 mg/m$^2$, greater than or equal to 5 mg/m$^2$, greater than or equal to 10 mg/m$^2$, greater than or equal to 50 mg/m$^2$, greater than or equal to 100 mg/m$^2$, or greater. In some embodiments, nanowire layers may have an AMD of less than or equal to 1000 mg/m$^2$, less than or equal to 500 mg/m$^2$, less than or equal to 200 mg/m$^2$, less than or equal to 100 mg/m$^2$, or less. It should be understood that in some embodiments, the AMD of the nanowire layer may correspond to any appropriate combination of the above-mentioned ranges. For example, in some embodiments, the AMD of a nanowire layer may be between or equal to 100 mg/m$^2$ and 1000 mg/m$^2$. However, AMD ranges for the nanowire layer in the various embodiments disclosed herein may be both greater and less than the ranges noted above depending on the particular design parameters used for the electrode.

As used herein, sheet resistance is a measure of the resistance of a layer or multi-layer with a sheet-like geometry to the conductive flow of electrons. One familiar with the state of the art could measure sheet resistance by a linear four-point probe (4PP) test as described in Example 1 below. In some instances, a layer or multi-layer's sheet resistance equals the product of the layer or multi-layer's resistivity and its thickness. In some instances, a layer or multi-layer's sheet resistance equals the thickness of the layer or multi-layer divided by the conductivity of the layer or multilayer. In the context of this document, sheet-resistance is thus understood to quantify both the resistivity and the conductivity of a layer or multi-layer. Furthermore, in the context of this document, sheet resistance, resistivity, resistance, and conductivity may all be used interchangeably to refer to a material's ability to conduct electrons, with lower values of resistivity, resistance, and sheet resistance, and higher values of conductivity, being associated with increased ability to conduct electrons.

In view of the above, the resulting composite electrodes disclosed herein may have any appropriate sheet resistance. However, in some embodiments, the various layer thicknesses, materials of the layers, concentrations of particular components in a given layer (e.g. particle and/or nanowire density), and/or other appropriate parameters may be selected to provide a desired average sheet resistance. This average sheet resistance may be greater than or equal to 1 Ω/sq, greater than or equal to 2 Ω/sq, greater than or equal to 5 Ω/sq, greater than or equal to 10 Ω/sq or greater, and/or may be less than or equal to 100 Ω/sq, less than or equal to 90 Ω/sq, less than or equal to 75 Ω/sq, less than or equal to 50 Ω/sq, or less. It should be understood that in some embodiments, the average sheet resistance may correspond to any appropriate combination of the above-mentioned ranges. For example, in some embodiments, the average sheet resistance may be between or equal to 5 Ω/sq and 100 Ω/sq. However, average sheet resistances for a composite electrode as disclosed may be both greater and less than the ranges noted above depending on the particular design parameters used for the electrode.

The particles used to form the layers described herein may correspond to any appropriate particle compatible with the deposition methods and materials described herein. Appropriate particles may include: atomically thin materials such as graphene oxide and reduced graphene oxide particles, MXene (2 dimensional transition metal carbides/nitrides); metal oxide particles (e.g. zinc oxide, tin oxide, and other appropriate metal oxides); carbon nanotubes; metal nanoparticles (e.g. gold, silver, platinum, and other appropriate metal nanoparticles) which in some embodiments may be functionalized depending on the particular deposition process used to deposit the layer; and/or any other appropriate type of particle capable of forming a colloidal suspension, and in an electrophoretic deposition deposited layer exhibiting sufficiently low sheet resistance such that the particles may be deposited using electrophoretic deposition.

While particles with any desired size may be used, in some embodiments, particles used to form the layers of an electrode may have an average maximum dimension that is less than or equal to 10 microns, less than or equal to 1 micron, less than or equal to 500 nm, less than or equal to 100 nm, less than or equal to 50 nm, less than or equal to 10 nm, or less, and/or greater than or equal to 1 nm, greater than or equal to 5 nm, greater than or equal to 10 nm, greater than or equal to 50 nm, greater than or equal to 100 nm or greater, given that EPD works for a wide range of particle sizes from quantum dots to micron sized flakes. In some embodiments, the average maximum dimension of particles used to form layers of an electrode may correspond to any appropriate combination of the above-mentioned ranges. For example, in some embodiments, the average maximum dimension of particles may be between or equal to about 10 nm and 10 microns. Of course, it should be understood that materials other than those noted above as well as particles with dimensions greater than or less than those noted above may be used as the disclosure is not so limited. The average maximum dimension of particles could be determined, for example, by transmission electron microscopy, scanning electron microscopy, and/or atomic force microscopy for deposited particles and/or by dynamic light scattering (DLS) for particles in solution.

In some embodiments, the composite electrodes described in the various embodiments herein may be at least partially transparent to a desired wavelength of light and/or range of wavelengths. The degree of transparency of an electrode may be a function of various parameters including, but not limited to, layer thickness, materials, density of nanowires within a layer, and other appropriate parameters. In some embodiments, the transparency of a composite electrode at a given wavelength may be greater than or equal to about 50%, 60%, 70%, and/or any other appropriate transparency. Correspondingly, the transparency of the composite electrode may be less than or equal to about 95%, 90%, 80%, 70%, and/or any other appropriate transparency. Combinations of the foregoing are contemplated including, for example, a transparency between or equal to about 50% and 95% at a desired wavelength. However, transparencies for a composite electrode as disclosed may be both greater and less than the ranges noted above depending on the particular design parameters used for the electrode.

In some embodiments, the noted transparencies may be the transparency of the composite electrode for electromagnetic radiation having a wavelength of less than or equal to 600 nm, less than or equal to 650 nm, less than or equal to 700 nm, less than or equal to 750 nm, or less, and/or greater than or equal to 300 nm, greater than or equal to 350 nm, greater than or equal to 400 nm, greater than or equal to 450 nm or greater. In some embodiments, the transparency may be measured for a wavelength, or range of wavelengths, corresponding to any appropriate combination of the above-mentioned ranges. For example, in some embodiments, the transparency may be measured for a wavelength, or range of wavelengths, between 300 nm and 750 nm, though electrodes with transparencies at wavelengths outside of these ranges are also contemplated. The noted transparencies may be measured using any appropriate measurement technique including the use of an integrating sphere as described in the examples below.

As used herein, an "atomically thin material" will be understood to have its plain and ordinary meaning in the art. Specifically, atomically thin materials typically have strong chemical bonds within a plane or layer, but have relatively weaker bonds out of the plane with neighboring planes or layers. Therefore, atomically thin materials typically form sheets of material that may be a single atom thick, i.e. monolayer sheets, to thicker sheets that include several adjacent planes of atoms. For example, an atomically thin layer and/or material may be considered to be a sheet or layer of material including one or more adjacent crystal planes extending parallel to a face of the sheet or layer. An atomically thin material may have a thickness corresponding to any appropriate number of crystal planes including sheets with a thickness corresponding to 1 atomic layer, or in some instances, a thickness that is less than or equal to 2, 3, 4, 5, or 10 atomic layers, or any other appropriate number of atomic layers. Further, depending on the particular type of atomically thin layer and/or material being used, the atomically thin layer and/or material may have a thickness between 0.1 nm and 10 nm, or between 0.3 nm and 5 nm, or between 0.345 nm and 2 nm. However, ranges both larger and smaller than those noted above are also contemplated as the disclosure is not so limited. Atomically thin materials may also be referred to as ultra-strength materials and/or two-dimensional materials.

As used herein, a nanowire may correspond to a structure that has longitudinal dimension that is significantly larger than its lateral dimension. Further, the lateral dimension of a nanowire may be greater than or equal to about 0.5 nm, greater than or equal to about 1 nm, greater than or equal to about 5 nm, or greater, and/or may be less than or equal to about 200 nm, less than or equal to about 100 nm, less than or equal to 50 nm, or less. It should be understood that in some embodiments, the lateral dimension of a nanowire may correspond any appropriate combination of the above-mentioned ranges. For example, in some embodiments, the lateral dimension of a nanowire may be between or equal to about 0.5 nm and 200 nm. However, the lateral dimension for a nanowire in a composite electrode as disclosed may be both greater and less than the range noted above depending on the particular design parameters used for the electrode. The lateral dimension for a nanowire could be determined, for example, by atomic force microscopy, transmission electron microscopy, and/or scanning electron microscopy.

Nanowires may have any appropriate longitudinal size for the particular material being used and the intended application. However, in some embodiments, a nanowire may have a maximum longitudinal dimension that is greater than or equal to 20 times a maximum lateral dimension of the nanowire, greater than or equal to 50 times a maximum lateral dimension of the nanowire, greater than or equal to 100 times a maximum lateral dimension of the nanowire, greater than or equal to 200 times a maximum lateral dimension of the nanowire, or greater, and/or less than or equal to 500 times a maximum lateral dimension of the nanowire, less than or equal to 200 times a maximum lateral dimension of the nanowire, less than or equal to 100 times a maximum lateral dimension of the nanowire, less than or equal to 50 times a maximum lateral dimension of the nanowire, or less. It should be understood that in some embodiments, the maximum longitudinal dimension of a nanowire may correspond any appropriate combination of the above-mentioned ranges. For example, in some embodiments, the maximum longitudinal dimension of a nanowire may be between or equal to about 20 and 500 times a maximum lateral dimension. However, the maximum longitudinal dimension for a nanowire in a composite electrode as disclosed may be both greater and less than the range noted above depending on the particular design parameters used for the electrode. The maximum longitudinal dimension for a nanowire could be determined, for example, by scanning electron microscopy or optical microscopy.

The transparent composite electrodes described herein may be used in any application where a transparent electrode may be desired. For example, applications for transparent electrodes may include, but are not limited to, applications and solar cells, displays, touch screens, and transparent heaters to name a few.

Turning to the figures, specific non-limiting embodiments are described in further detail. It should be understood that the various systems, components, features, and methods described relative to these embodiments may be used either individually and/or in any desired combination as the disclosure is not limited to only the specific embodiments described herein.

FIGS. 1A-1H depict one embodiment of a method for forming an electrode. In a first step, a release layer 102 is deposited onto a substrate 100, see FIGS. 1A-1B. As noted previously, the release layer may be applied using any appropriate deposition technique, including, but not limited to, spin coating, spray coating, doctor blade coating, dip coating, and/or any other appropriate application technique capable of applying the release layer to the underlying substrate.

After applying the release layer, a first layer 104 is deposited onto the release layer 102, see FIG. 1C. This first layer may comprise a plurality of particles, which in some embodiments, may also be at least partially transparent. In some embodiments, the first layer may be deposited using electrophoretic deposition. Specifically, the substrate 100 including the release layer may be at least partially immersed into a solution including a suspension of the particles. Depending on the particular embodiment, the conductive particles located in the solution may be charge stable within the solution during a deposition process. Further, the particles may be charged such that a voltage potential will bias them towards the substrate. Accordingly, when a deposition voltage potential is applied to the substrate, the conductive particles may be deposited onto the release layer via an electrophoretic deposition process to form the first layer disposed on the release layer. The electrophoretic deposition may be continued until a layer with a thickness that is greater than or equal to at least several conductive particle thicknesses has been deposited. Appropriate thicknesses for the first layer may be between or equal to about 15 nm and 100 nm though layer thicknesses both less than or greater than this range are also contemplated. In either case, in some embodiments, the resulting first layer may be viewed as being substantially continuous and may be substantially impermeable to a surrounding atmosphere such as atmospheric air. Further, a thickness and material of the first layer may be selected to provide a desired overall electrode sheet resistance. For example, in the instance of graphene oxide, which is typically considered an insulator, the average thickness of the first layer may be selected to be sufficiently thin such that the overall sheet resistance of the composite electrode is still within a desired range of sheet resistance.

After depositing the first layer 104, a conductive nanowire layer 106 may be deposited onto the first layer in any appropriate manner. For example, conductive nanowires may be deposited onto an exposed surface of the first layer using spin coating, spray coating, doctor blade coating, drop casting, dip coating, and/or any other appropriate method, see FIG. 1D. Depending on the specific method used to form the conductive nanowire layer, concentrations of the nanowires within a solution, such as an aqueous solution or a non-aqueous solution comprising a solvent such as isopropyl alcohol, may be between about 2 mg/mL and 5 mg/mL. However, concentrations both greater and less than this range are also contemplated.

As shown in FIG. 1E, once the conductive nanowire layer has been formed, a third layer 108 may be deposited onto the exposed surface of the conductive nanowire layer 106. Similar to the first layer, the third layer may be made from particles that are in electrical contact with one another and the underlying second layer of conductive nanowires. The particles of the first and third layers may either be the same or different from one another as the disclosure is not limited in this fashion. Since the conductive nanowires are susceptible to corrosion, the third layer may not be deposited using electrophoretic deposition. Instead, the third layer may be deposited using an electroless deposition process. For example, a dip deposition method may be used where the substrate 100 including the release layer 102, first layer 104, and nanowire layer 106 disposed thereon are immersed in a solution including a suspension of the particles. Similar to the above, the solution including the suspension of particles may either be an aqueous solution or a non-aqueous solution. The particles within the solution may deposit onto the exposed surface of the conductive nanowire layer to form the desired third layer. In some embodiments where the third layer is formed by a dip process, or other appropriate process, an average thickness of the third layer may be on the order of one to two times a thickness of the particles used to form the third layer. However, instances in which a thicker layer is formed are also contemplated. Similar to the first layer, a thickness and material of the third layer may be selected such that the overall composite electrode may exhibit a desired sheet resistance.

Referring to FIGS. 1E and 1F, an appropriate solvent that is compatible with the deposited layers is applied to the composite electrode including the substrate 100 and the layers deposited thereon. For example, the assembly may be immersed in the solvent for a predetermined amount of time sufficient to dissolve the release layer disposed between the first layer of conductive particles 104 and the substrate. Appropriate solvents may include but are not limited to, acetone, de-ionized water, and/or any other appropriate solvent. Once the release layer is dissolved, the composite electrode including the first layer 104, conductive nanowire layer 106, and third layer 108 may be detached from the substrate. In some embodiments, the composite electrode may be attached using a water based lift off method, mechanical detachment and/or initiation (e.g. initiating detachment at a corner or edge of the electrode), combinations of the forgoing, and/or any other appropriate method to detach the composite electrode from the substrate as shown in FIG. 1F.

After being detached from the substrate, the composite electrode may be transferred onto a second substrate 110 with either the first layer 104 or third layer 108 facing away from the adjacent surface of the second substrate. In some embodiments, the second substrate may be a substantially transparent substrate, though embodiments in which an opaque or partially transparent substrate is used are also contemplated. Thus, the depicted method may be used to form a transparent electrode on the second substrate with a conductive nanowire layer sandwiched between two opposing layers made from conductive particles, and which in some embodiments may isolate the conductive nanowire layer from a surrounding environment which may improve a corrosion resistance and durability of the electrode compared to prior systems made with conductive nanowires. In some embodiments, the electrode may be transferred onto a substantially planar surface of a second substrate. However, in other embodiments, the electrode may be transferred onto a substantially non-planar surface of the substrate, such as a curved surface of the substrate.

Figure 2:
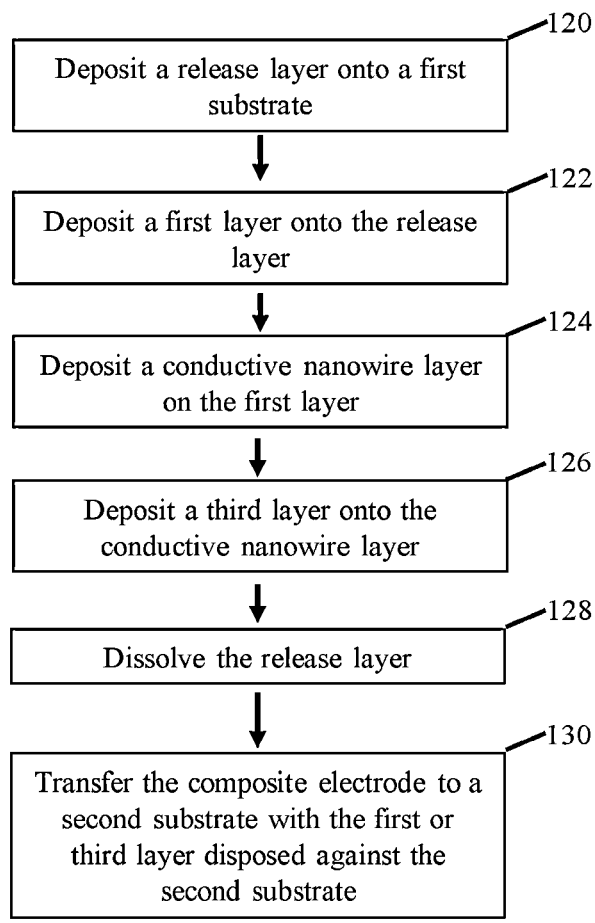
FIG. 2 presents one embodiment of a method for the formation and transfer of a transparent electrode.

FIG. 2 depicts the steps of one embodiment of a method for forming a composite electrode consistent with the embodiment illustrated in FIGS. 1A-1H. In one embodiment forming a composite electrode includes depositing a release layer onto a first substrate at 120 using any appropriate deposition technique as described above. A first layer including a plurality of particles may then be deposited onto the release layer at 122. As described previously, the first layer may correspond to a continuous particle layer that is deposited onto the release layer using an electrophoretic deposition technique. The resulting composite structure may then have a conductive nanowire layer deposited onto at least a portion of the first layer 124 such that the first layer is disposed between the conductive nanowire layer and the release layer. Subsequently, a third layer including a plurality of particles may be deposited onto at least a portion, and in some instances all, of the conductive nanowire layer at 126 using any appropriate deposition technique including but not limited to, a dip deposition process where an exposed surface of the conductive nanowire layer is exposed to a solution including the particles suspended in the solution as noted above. After the desired composite structure including the various layers is formed, the release layer may be dissolved at 128 using any appropriate dissolution process as described further above. The composite electrode may then be transferred to a second substrate at 130 using any appropriate transfer technique. Depending on the particular embodiment, an exterior surface of either the first or third layer may be oriented towards and disposed against the second substrate. In some embodiments, the first or third layer may either be in direct contact with the second substrate, or indirect contact with the second substrate with one or more intermediate layers disposed therebetween, as the disclosure is not limited in this fashion.

In the above method, the various layers may be dried in any appropriate manner between the various steps. For example, elevated temperatures, exposure to dry and/or inert atmospheres, blowing with dry nitrogen or other suitable gases, and/or any other appropriate method may be used for drying the various layers prior to the next processing step.

Example: Experimental Summary

In the below experimental examples, a fabrication process is disclosed that utilizes a scalable and economically viable electrophoretic deposition (EPD) method and Graphene Oxide (GO) solution dip treatment to fabricate highly stable transparent electrode where the conductive silver nanowire (AgNW) network is effectively 'sandwiched' between a seamless electrophoretically deposited graphene oxide film with tunable thickness, and ultrathin GO (Dip-GO) composed of 1~2 layers. It is demonstrated that the GO layers enhance contact between nanowires to reduce the junction resistance, mitigating the need for treating nanowires at high temperature. The films demonstrated excellent sheet resistance as low as 15 Ω/sq and a tunable transmittance of 70~87% by simply tuning the EPD parameters.

Furthermore, the increase in the film stability was shown to depend largely on which GO layer was being utilized. When protected by Dip-GO (facing-up), stability reinforcement of the electrode was observed, although partial degradation can still occur. However, when protected by electrophoretic deposited graphene oxide film (facing-up), the composite electrode retained its original sheet resistance under long-term storage at 80° C. The exceptional chemical stability offered by the electrophoretically deposited graphene oxide layer was verified by the absence of major silver corrosion products for the AgNW as indicated by X-ray photoelectron spectroscopy (XPS). Finally, for the first time, an in situ voltage ramping test up to 20V was performed on a GO-AgNW composite structure. The results indicate a novel stabilization behavior enabled by the presence of GO that prevents abrupt divergence of the resistance to the MΩ range experienced by bare AgNW networks.

Importantly, the disclosed process allowed the film to be transferred to arbitrary surfaces with desired orientation such that either electrophoretic deposited graphene oxide or Dip-GO was facing up. This freedom adds versatility for future device integration where it may be desirable to emphasize certain properties over others as they are strongly correlated to the thickness/robustness of the GO protecting layer being used. For instance, a thick GO layer offering increased chemical and electrical stability at elevated temperatures and high voltages could be preferentially used at the top when integrating this film in a transparent heater, while an ultrathin GO layer could be preferentially used as an interfacial layer in solar cells as a way to enable Ohmic transport and optimize the energy level matching with other layers.

Examples: Sample Processing

Figure 3A:
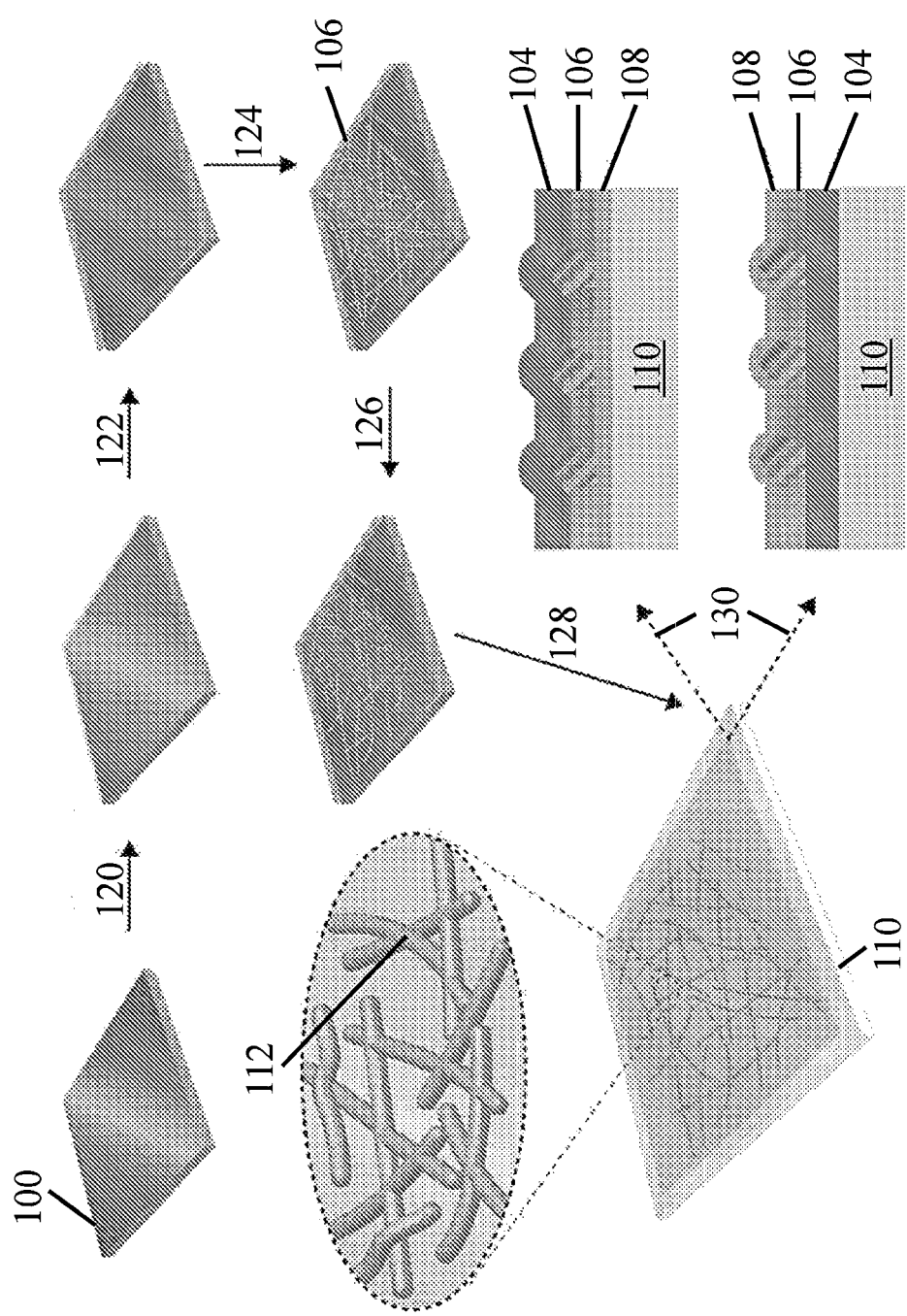
FIG. 3A illustrates one embodiment of a method for the formation and transfer of a transparent composite electrode.

A fabrication process utilizing electrophoretic deposition (EPD) and solution dip-treatment was used in order to create an electrophoretic deposited graphene oxide/AgNW/GO hybrid composite transparent conductor. The process is illustrated in FIG. 3A and includes: i) depositing a release layer of sacrificial cellulose acetate (CA) layer on stainless steel (SS) substrate, 120, ii) depositing a first layer of GO on to the release layer by EPD, 122, iii) depositing a conductive AgNW layer on the first layer of GO, 124, iv) depositing a third layer onto the conductive nanowire layer via a dip treatment in GO solution, 126, v) dissolving the release layer in an acetone bath, 128, and vi) transferring the composite electrode to a second substrate with the first or third layer disposed against the second layer, 130. This process is described in more detail below.

Figure 3B:
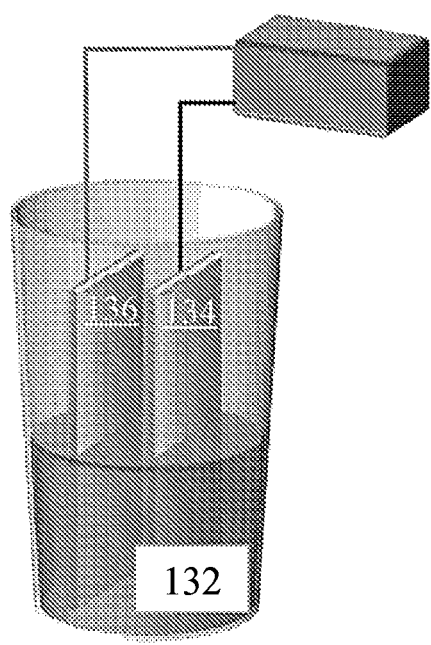
FIG. 3B is one embodiment of a system for performing electrophoretic deposition.

EPD is a colloidal deposition technique where an electric field is created within a colloidal suspension by applying a constant voltage between a positive electrode 136 and a negative electrode 134 immersed in the solution 132 (FIG. 3B). This attracts and deposits the charged colloidal particles to the electrode with opposite charge to form a dense film. As GO dispersed in water is negatively charged due to the abundant deprotonated carboxylate groups, deposits will be formed on the positively biased anode upon EPD. The advantages of EPD include low cost, rapidity, simple equipment, controllable deposition rate, uniformity of deposition, and the possibility to be performed on surfaces with complex morphologies. In conventional EPD, as the deposition substrate is the electrode, it is difficult to detach the deposited film from the SS substrate (electrode). Therefore, in order to allow transfer of the film from the substrate, a sacrificial layer made of cellulose acetate (CA) was coated on the SS substrate prior to EPD in order to liberate the deposited structure upon immersing in acetone, allowing transfer of the final electrophoretic deposited graphene oxide/AgNW/GO film to arbitrary surfaces.

Upon deposition of the first GO layer by EPD (EPD-GO) on SS substrate to form EPD-GO/SS, AgNW was coated on top of the EPD-GO/SS by spin coating. The density of the AgNW is primarily responsible for the sheet resistance of the film and can be tuned by changing the concentration of AgNW solution and spin speed. It should be noted that the method of AgNW deposition can vary, and the inherent wettability of the GO allows AgNW to be easily coated by either spin coating or spray coating. Therefore, the process has the flexibility to accommodate a variety of existing conductive nanowire coating techniques.

The resulting AgNW/EPD-GO/CA/SS structure is then simply dipped in GO, rinsed in water, and blow-dried. This dip-treatment covers the exposed AgNW with ultrathin GO flakes in order to mechanically weld or fix the AgNW onto the EPD-GO layer and to create a sandwiched structure of GO/AgNW/EPD-GO/CA/SS. Without wishing to be bound by theory, electrostatic attraction between AgNW and GO flakes in solution causes the AgNW network to be covered in a ultrathin GO coating composed of only a few layers. The subsequent acetone bath detaches the EPD-GO/AgNW/GO film and allows transfer to arbitrary surfaces. As illustrated at the end of the process schematic of FIG. 3A, transfer of the final conductive composite film can be accomplished in two different orientations, where either the EPD-GO layer 104 or the Dip-GO layer 108 is facing up with respect to the target substrate.

Using the above general processing method, samples were prepared with the following sample preparation methodology. Prior to EPD, two 2.54 cm×2.54 cm 316 stainless steel plates (McMaster Carr) were cleaned thoroughly by ultrasonication in acetone, followed by rinsing in ethanol and deionized water. One of the plates to be used for EPD deposition was then spin-coated with cellulose acetate (Sigma Aldrich) solution in acetone (4 mg/mL) with a spin speed of 900 rpm for 1 minute. The steel plates were then attached in parallel to each other in an electrophoretic deposition (EPD) cell with a fixed distance of 5 mm. The deposition substrate with cellulose acetate coating was attached to the positive contact as an anode. The electrodes were then immersed in a diluted aqueous GO solution (Graphenea), and a constant voltage of 5V was applied across the EPD cell for 4 minutes using a Tektronix PS-282 DC power supply, leaving a thin film of EPD-GO on the anode. The electrodes were then slowly withdrawn from the GO solution. The EPD-GO on stainless steel plate was spin-coated with AgNW (50 nm) solution in isopropyl alcohol (2 mg/mL, ACS Materials) with a spin speed of 600 rpm for 40 seconds. The resulting AgNW product on stainless steel plate was then immersed in 1.5 mg/mL aqueous GO solution for 1 minute before being rinsed by deionized water and blow-dried with nitrogen gas. Finally, the entire film on stainless steel plate was immersed in acetone for at least 6 hours and then transferred to deionized water. The transparent EPD-GO/AgNW/GO film was then liberated from the underlying steel substrate and transferred to a transparent insulating substrate such as glass (Corning Eagle XG) or PET (DuPont Teijin). Finally, the transferred film was dried on a hot plate at 50° C. and thoroughly rinsed with acetone and ethanol.

Example 1: Sample Characterization and Testing

Figure 4A:
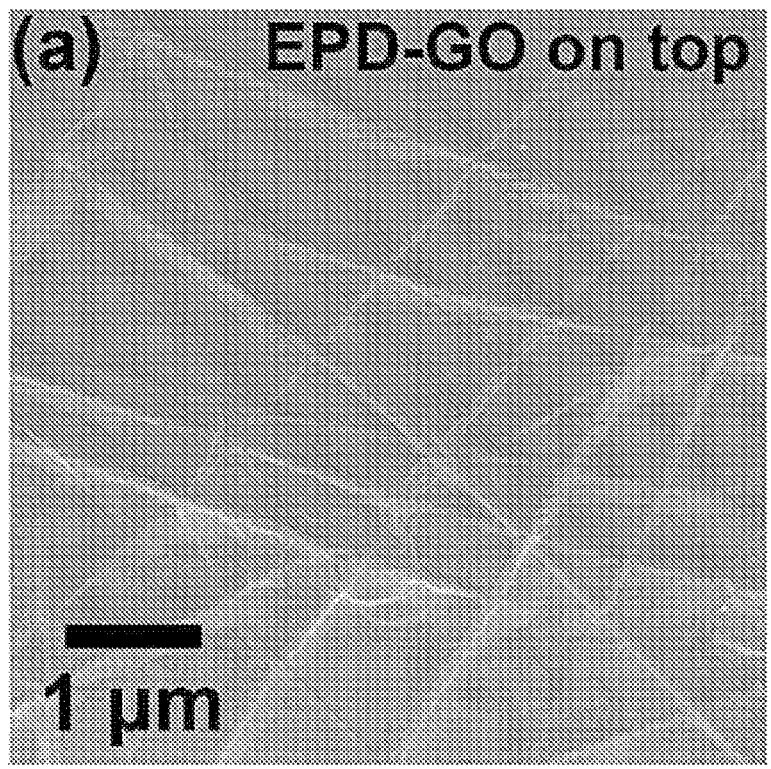
FIGS. 4A-4D are scanning electron micrographs of a composite electrode film in various perspectives.
Figure 4B:
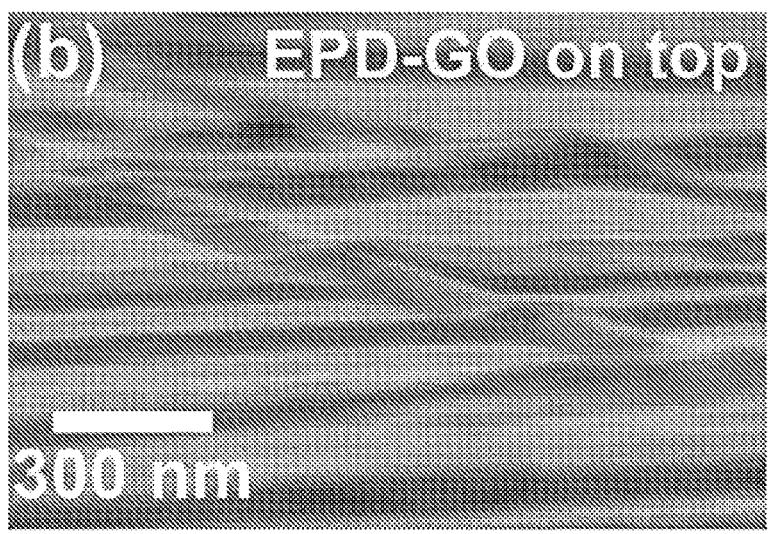
Figure 4C:
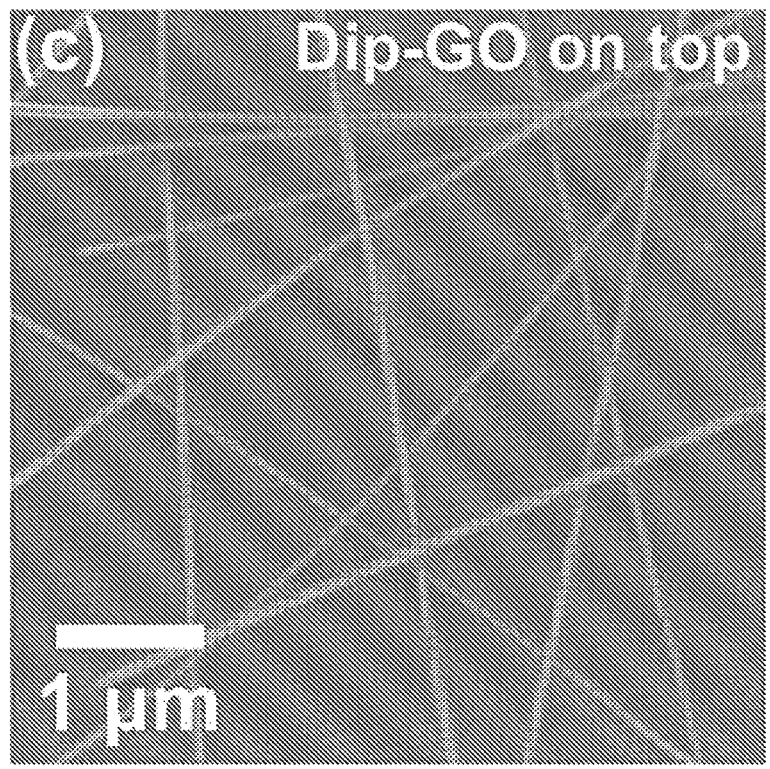
Figure 4D:
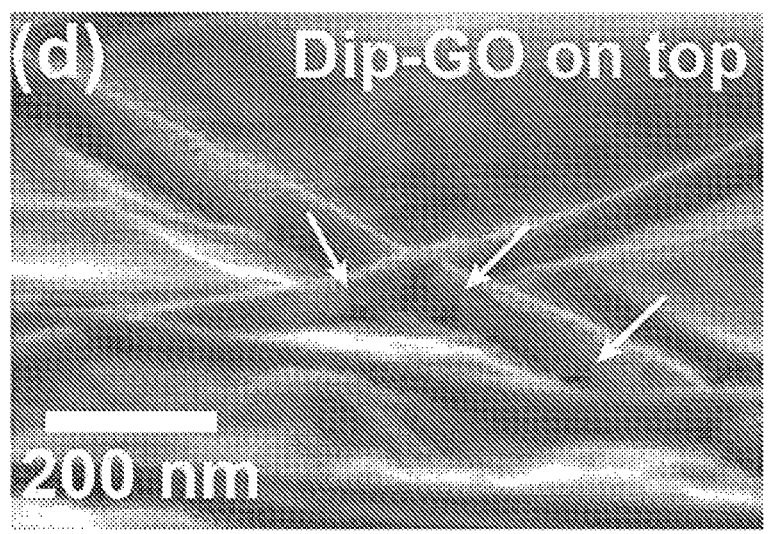

The disclosed fabrication process utilizing both EPD and solution dip treatment is not only scalable and cost-effective compared to existing techniques, but is also beneficial as it results in a novel composite structure where the AgNW network is 'sandwiched' by two GO layers synthesized by two different means. The EPD-GO and Dip-GO that covers the AgNW network offer different properties to the final composite structure, owing to their structural differences which were characterized by scanning electron microscopy (SEM). FIGS. 4A and 4B show respectively the top and tilted view of the EPD-GO/AgNW/GO film where EPD-GO is facing up, and illustrates EPD-GO film following the topography of the underlying AgNW network. It is notable that thanks to the capability of EPD to form continuous films over macroscopic areas, EPD-GO did not show any notable discontinuities such as gaps or holes that would expose the underlying AgNWs to external environment. FIGS. 4C and 4D are analogous images where Dip-GO is facing up. Contrary to EPD-GO, it was difficult to conclude that GO was seamlessly covering the NWs. In most areas, it appears seamlessly covered with GO judging based on little contrast difference of the NWs. FIG. 4C, which is the top-down SEM view of the Dip-GO treated side of the film, clearly shows individual AgNW surfaces even at a low acceleration voltage of 1 kV due to the ultrathin nature of GO. The contrast was observed to be uniform on the NWs, indicating GO flakes were completely covering the NWs in view. However, nanoscale gaps between GO flakes exposing bare AgNW were detected from the tilted view of another region of the same sample, FIG. 4C, as indicated by the arrows. This may be due to the stochastic nature of the Dip-treatment as well as due to size differences between GO flakes, and will have implications in terms of the AgNWs' chemical stability as will be discussed subsequently. Finally, an SEM cross-section image 4E of the EPD-GO/AgNW/GO film clearly reveals the morphology of the film where NWs are covered by a thicker EPD-GO on one side, and an ultrathin GO layer on the other side, demonstrating the effectiveness of the simple and solution-compatible process in creating a GO/AgNW/GO structure.

Utilizing EPD in the fabrication process allows the thickness of the GO to be easily controlled by simply tuning the deposition parameters. Among such parameters, the GO solution concentration was varied, while the deposition voltage and time were fixed in all experiments. The thickness of EPD-GO films characterized by AFM was plotted as a function of GO concentration in FIG. 4F, revealing that the relationship between the thickness and GO solution concentration is close to linear. This is in good agreement with previous studies on the EPD of GO films and is also in line with the Hamaker's law for EPD which states that the deposit mass is a linear function of the solution concentration. Implementation of EPD in the disclosed process allows facile tuning of the GO thickness from roughly 15 nm to 100 nm. This in turn enables the optical transmittance (at 550 nm) to be easily tuned across a wide range from 75% to above 90%, FIG. 4F, compatible with various optoelectronic technologies using transparent conducting layers. With longer deposition times and higher GO concentration, even thicker microns-thick GO films can be easily realized through EPD. Films with thicker GO-AgNW hybrid structure could potentially find applications in conductive membranes for electrochemical devices or electromagnetic interference (EMI) shielding.

Figure 5:
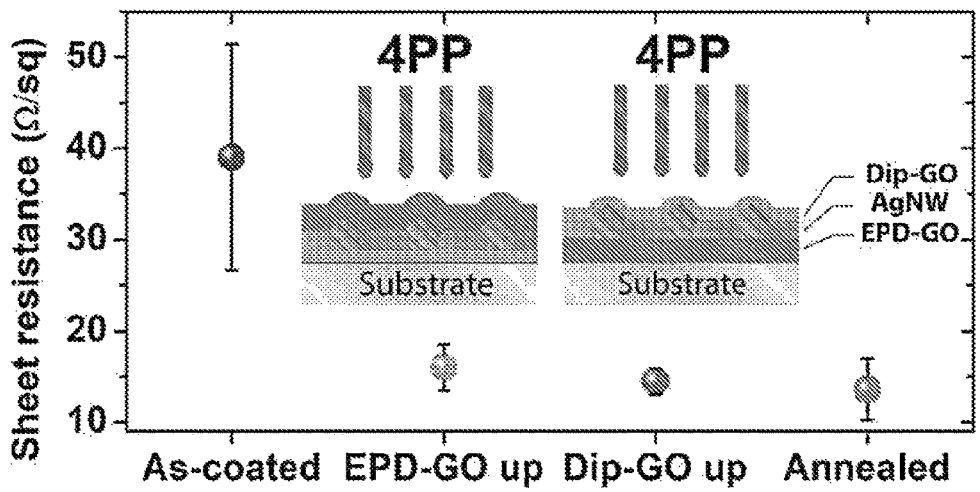
FIG. 5 is a graph of sheet resistance of composite electrodes compared with bare AgNW networks.

The mean sheet resistance and transmittance at 550 nm may be an important optoelectronic performance metric for transparent conductors in general. However, for conductive nanowire networks, electrical uniformity as well as light scattering also deserve attention. In particular, ensuring low sheet resistance uniformly throughout AgNW networks may be challenging due to the high resistances between individual AgNWs at the junctions and potential lack of uniformity in the AgNW coverage itself, as opposed to conductive metal oxides with continuous film morphology. To assess the magnitude and homogeneity of the manufactured films, a linear four-point probe (4PP) was used to measure the sheet resistance of the samples at 5 different locations. Although GO is an insulator, 4PP measurement was possible for sufficiently thin GO thicknesses below 25 nm, which was achieved for EPD-GO fabricated with 0.08 mg/mL and 0.15 mg/mL GO solution. FIG. 5 shows the mean sheet resistances of the samples with various configurations, along with the error bars which indicate standard deviations over the 5 values measured in each case. As-coated bare AgNW networks exhibited a mean sheet resistance of 40 Ω/sq with a large standard deviation of 12 Ω/sq, indicating that the resistance between wires is not only high but is also widely varying. In contrast, GO-coated AgNW annealed at 200° C. for 50 minutes showed a sharp reduction of sheet resistance to 13.6 Ω/sq and a reduced standard deviation of 3.3 Ω/sq, indicating that the majority of NW junctions have sintered to form more low-resistance conduction pathways. The disclosed EPD-GO/AgNW/GO films demonstrated similarly low and homogeneous mean sheet resistance values. For both the EPD-GO side (0.08 mg/mL GO) and the Dip-GO side, mean sheet resistance values were 16 Ω/sq and 14.5 Ω/sq, with standard deviations of 2.5 Ω/sq and 1.4 Ω/sq, respectively. As a consequence, electrical optimization was achieved without resorting to any thermal treatment.

To further investigate the origin of observed electrical optimization induced by the GO 'sandwich' structure, atomic force microscopy (AFM) was used to characterize the NW junctions. Junctions where two NWs crossed were identified in the AFM images of EPD-GO/AgNW/GO and bare AgNW, and the height across the junctions were measured and recorded. From the measurements, it was clear that the overall junction height was decreased for EPD-GO/AgNW/GO compared to bare AgNW, indicating partial, if not total interpenetration between NWs. The details of AFM measurements are reported in Example 3 below.

Figure 4E:
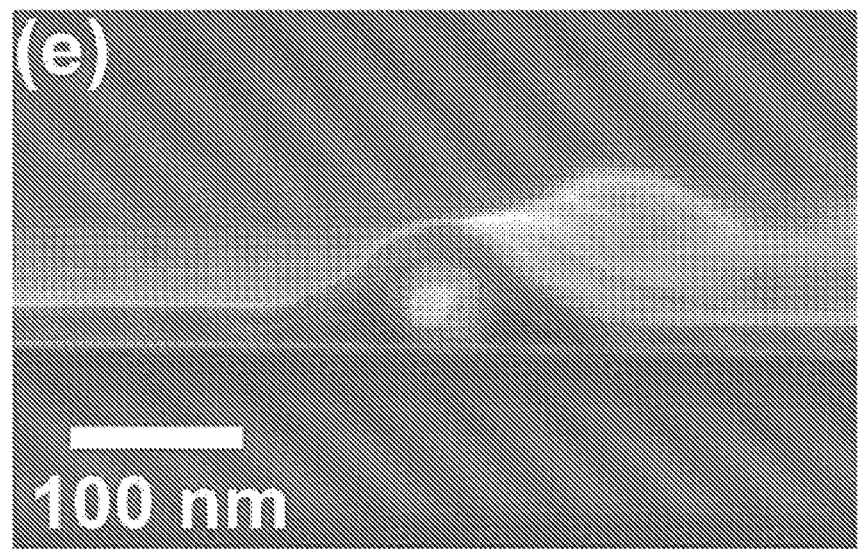
FIG. 4E is a scanning electron micrograph of a cross-section of a composite electrode.
Figure 4F:
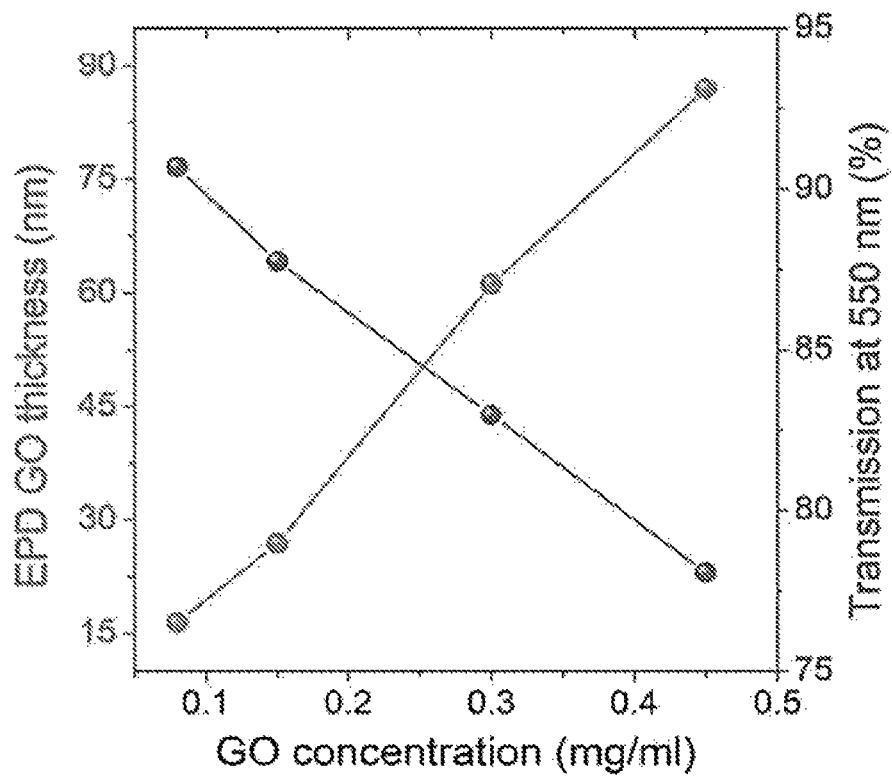
FIG. 4F is a graph of electrophoretic deposited graphene oxide film thickness and transmittance as a function of graphene oxide solution concentration.

The interpenetration of NWs was also visibly apparent from the SEM image of FIG. 4E. For both bare AgNW and EPD-GO/AgNW/GO films, single NWs were measured to have similar height of roughly 50~60 nm, which is equal to their actual diameter. However, the height measured for junctions of 2 or more wires are much lower for EPD-GO/AgNW/GO films than for bare AgNW where the height of the junctions multiply in magnitude in accordance with the number of NWs. It is likely that both the EPD-GO and the Dip-GO layer that covers the AgNW network enhances the physical contact between nanowires through downward force applied to the wires during drying of the film as well as from the adhesive force originating from hydrogen bonding between the GO nanosheets. Concurrently, the uniform coverage of EPD-GO over the underlying AgNW network ensures that such junction optimization occurs homogeneously throughout the film. The combined effect of GO encapsulation mitigates the need for high-temperature treatment of NWs, making the disclosed process favorable towards using flexible plastic substrates.

Figure 6:
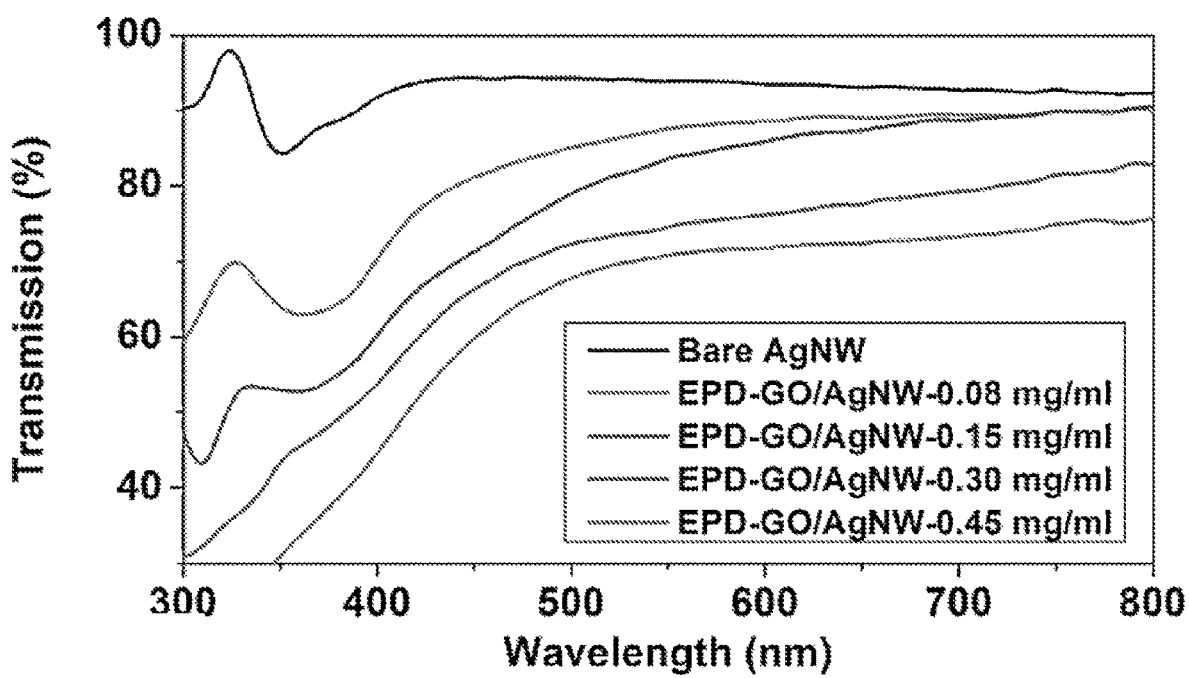
FIG. 6 is a graph of UV-Vis transmission spectra of transparent electrodes based on bare AgNW and the disclosed composite electrodes fabricated with different graphene oxide concentrations.

To assess the total transmittance and the degree of light scattering of the EPD-GO/AgNW/GO UV-Vis spectroscopy was performed with an integrating sphere setup. FIG. 6 shows the total transmittance spectra in the range of 350 nm to 800 nm where all transmittance values are reported where the contribution from underlying glass substrate is removed. It can be seen that the transparency of the film decreases with GO thickness and GO solution concentration used in EPD, as expected from the results shown in FIG. 4F. Using a GO solution concentration of 0.08 mg/mL for the EPD yielded the most transparent film, with a transmittance of 87.5% at 550 nm. As a reference, a printed text background was capable of being clearly imaged through this film on glass. Films fabricated with GO solution concentration of 0.15 mg/mL, 0.3 mg/mL, and 0.45 mg/mL had a transmittance of 83.7%, 74.5%, and 70.8% at 550 nm, respectively. The uncoated AgNW network with a similar density had a transmittance of 93.8%.

Figure 7:
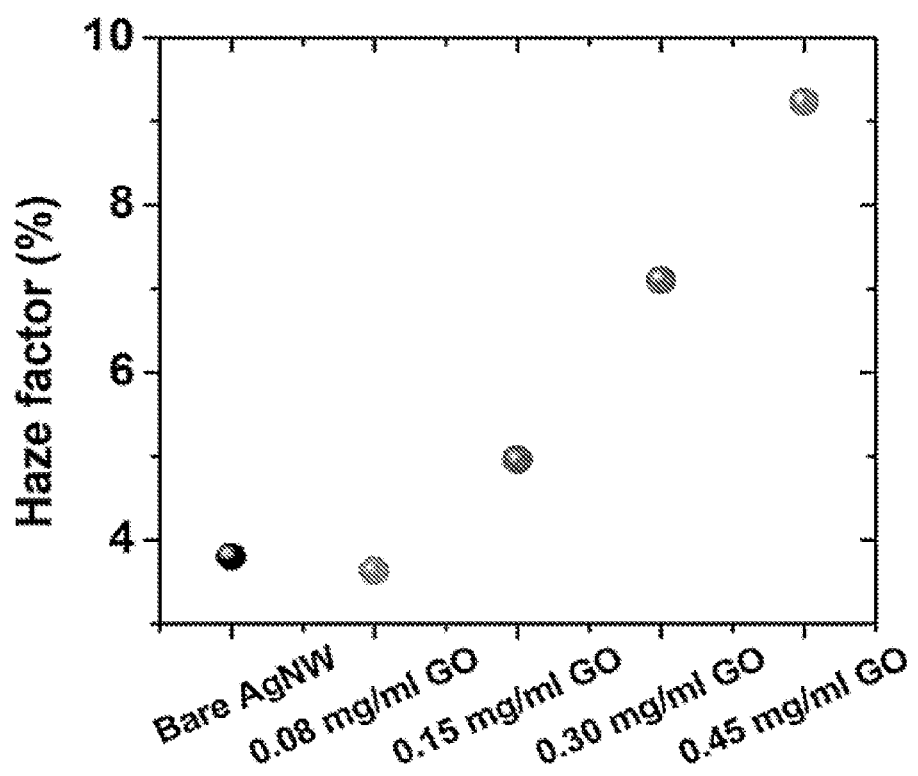
FIG. 7 is a graph of haze factor (averaged 400-700 nm) as a function of increasing electrophoretic deposited graphene oxide thickness.

The extent of light scattering can be assessed by calculating the haze factor, which is the ratio of diffuse transmittance to total transmittance. FIG. 7 shows the haze factor averaged in the 400-700 nm range for the EPD-GO/AgNW/GO films. The haze factor increases with increasing EPD-GO thickness, with 3.6%, 5.0%, 7.1%, and 9.2% for the EPD-GO/AgNW/GO film, while the haze factor for bare AgNW network was 3.8%. This is expected due to the random stacking of individual GO as well as the inhomogeneous nature of GO films which comprises of graphitic layers with various functional groups, void spaces and water molecules. The refractive index mismatch at the interfaces caused by these inhomogeneities may lead to pronounced scattering as light passes through thicker GO films. Overall, the results suggest that by controlling the EPD parameters of GO, it is possible to predictably tune the level of transparency and haze. This may have implications toward using the disclosed electrodes in various applications that use different optical characteristics. For instance, high haze factor has been shown to be beneficial in organic solar cells due to increased light path length while display applications tend towards the use of minimal haze.

The poor long-term stability of bare, uncoated metallic nanowires such as AgNW is one of the major obstacles impeding their application. Therefore, the stability of the disclosed EPD-GO/AgNW/GO electrodes was evaluated by observing the change of their sheet resistance for a period of 20 days in comparison with that of bare AgNW. Also, for EPD-GO/AgNW/GO electrodes, two cases were considered such that either EPD-GO or Dip-GO was facing the environment, and two different thicknesses of EPD-GO 15 nm and 25 nm were chosen such that their sheet resistances were measurable by 4PP. The samples were stored in air at 80° C. in order to accelerate the degradation kinetics, and were only taken out briefly once a day to measure the sheet resistance. The relative humidity change during the duration of experiment was also recorded (SI).

Figure 8A:
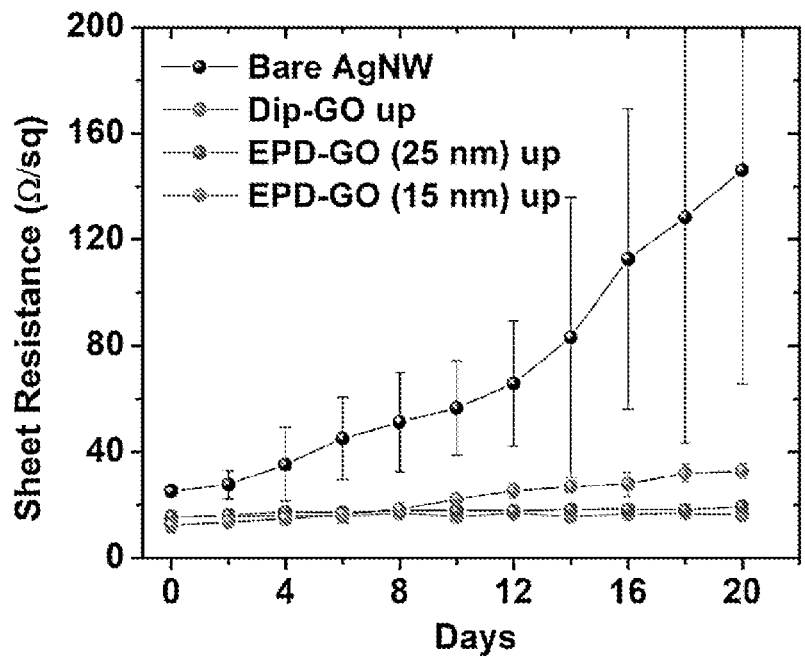
FIG. 8A is a graph of sheet resistance variation versus time for bare AgNW and the disclosed composite electrodes where either graphene oxide or electrophoretic deposited graphene oxide was facing up for samples stored at 80° C. for 10 days with 55% relative humidity.

FIG. 8A shows the variation of sheet resistance for bare AgNW and EPD-GO/AgNW/GO films. The samples had the same size and the same nanowire density. The aging process was carried out simultaneously for the samples. Bare AgNWs suffered from significant degradation as demonstrated by a 6-fold increase of their average sheet resistance after 20 days. Dip-GO provided some protection to the underlying NWs, but the mean sheet resistance still increased by 2.5 times after 20 days. In stark contrast, when EPD-GO was facing up and serving a protective role against the environment, underlying AgNWs retained its original sheet resistance for the entire duration of the experiment. Meanwhile, the error bars of FIG. 8A represent standard deviations of sheet resistance measured on different points on a sample, thus indicating the degree of electrical homogeneity. The error bars increase significantly with aging for bare AgNW network while for EPD-GO/AgNW/GO, it retains its low initial value. This preservation of high electrical homogeneity, suggests that the protection capability of EPD-GO is even across the film thanks to the continuous and seamless coating enabled by EPD. These results were reproduced with different nanowire batches at different periods, and the same stabilization behavior was observed when the AgNW network was protected by EPD-GO.

In order to explain the chemical stability, visual assessment by SEM imaging and chemical analysis by X-ray photoelectron spectroscopy (XPS) were performed on the bare AgNW and EPD-GO/AgNW/GO electrodes after the degradation experiment. It should be noted that when EPD-GO/AgNW/GO films are in the 'EPD-GO up' configuration, the thickness of GO film (>10 nm) hinders accurate XPS analysis of the underlying AgNW. Therefore, a double-sided carbon conductive tape was applied onto the film and removed, so that the entire film came off from the substrate with the tape without damage. This way, the film orientation was reversed such that AgNWs that had been covered by EPD-GO were exposed, allowing for their SEM and XPS characterization. FIGS. 8C-8F show SEM images of degraded bare AgNW and EPD-GO/AgNW/GO. The bare uncoated AgNW surface (FIG. 8C) exhibits nanoparticle-like features and larger aggregates. These features are most likely $Ag_2S$, as has been identified in previous works as the principal corrosion product of AgNW that forms by the reaction of Ag with atmospheric sulfur-containing species such as Carbonyl sulfide (OCS) and $H_2S$. It is known that even a trace amount of these species in vapor, when aided by humidity and temperature, can induce significant sulfidation of AgNW. Since $Ag_2S$ particles are semiconducting and grows at the expense of Ag, it tends to increase the resistivity of AgNWs by thinning down initially pure Ag and disrupting the continuity of NWs. It was observed that AgNW covered by Dip-GO (FIG. 8D) were also not free of such particles. In contrast, the surface of AgNW that had been covered by both thicknesses of EPD-GO are free of such rough features (FIGS. 8E-8F).

Figure 8B:
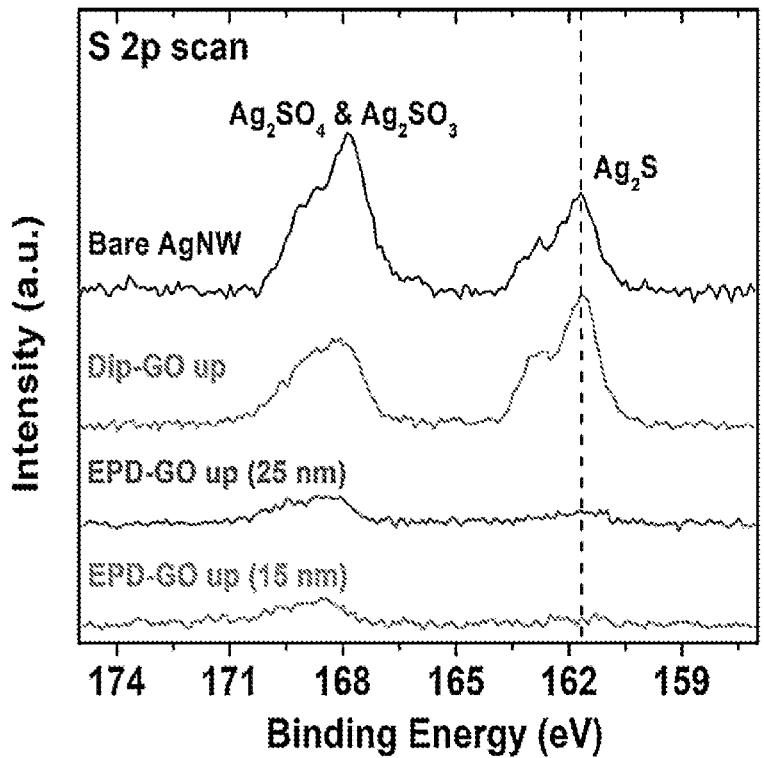
FIG. 8B is a graph of XPS S 2p scans of the samples of FIG. 8A.
Figures 8C, 8D, 8E, 8F:
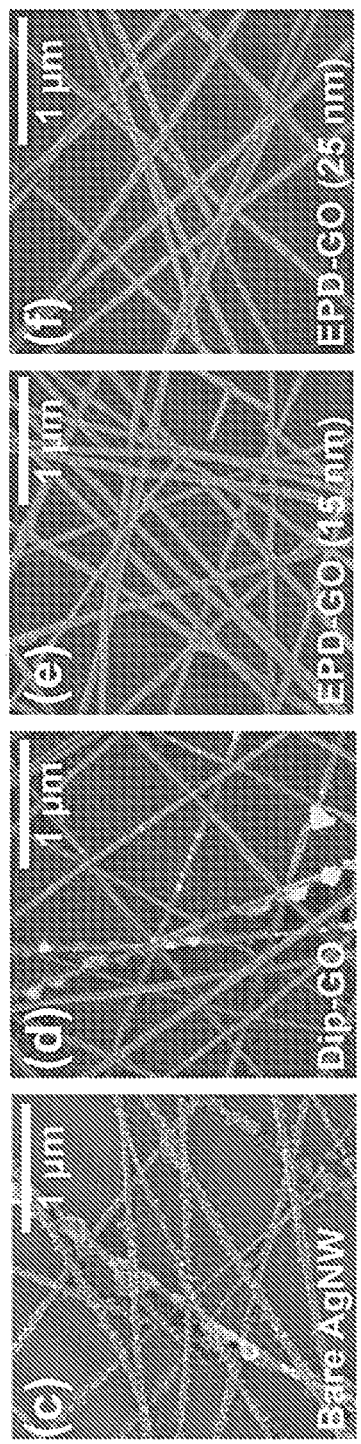
FIGS. 8C-8F are scanning electron micrographs of degraded bare AgNW and AgNW network that had been covered by graphene oxide and electrophoretic deposited graphene oxide.

The presence of sulfidation products for bare AgNW and absence of sulfides for the covered AgNW has been further confirmed by XPS scan in the S 2p region, as shown in FIG. 8B. For bare AgNW, a peak corresponding to $Ag_2S$ is clearly visible near ~162 eV, which can be deconvoluted into two peaks at 161.7 eV and 162.7 eV that corresponds to split energy levels caused by spin-orbit coupling. Another smaller peak situated at ~168 eV corresponds to sulfates, most likely $Ag_2SO_4$ or $Ag_2SO_3$, which are other common products of silver sulfidation.[42] Similarly for Dip-GO covered AgNW, peaks corresponding to $Ag_2S$ were clearly visible. This degradation can be explained by the small gaps between GO flakes which are shown in FIG. 4D. On the other hand, the S 2p scan of the AgNWs that had been covered by EPD-GO does not exhibit a sulfide peak expected at ~162 eV, which is evidence that chemical degradation was greatly suppressed. This is due to the seamless nature of GO films fabricated by EPD. Instead, sulfates were detected at ~169 eV for all EPD-GO/AgNW/GO samples, which can be attributed to the presence of $MnSO_4$ or $K_2(SO_4)_2$ originating from the underlying GO. This was further confirmed by XPS measurements performed on GO films only. As expected, sulfates of Mn and K were also observed in that case (SI), since $KMnO_4$ and $H_2SO_4$ are commonly used agents for the solution-based exfoliation of GO. Therefore, the larger sulfate peak observed for Dip-GO may be a combined signal originating from both $Ag_2SO_4$ or $Ag_2SO_3$ and $MnSO_4$ or $K_2(SO_4)_2$. The results show that Ag corrosion has been prevented by the exceptional gas-barrier properties of the seamless EPD-GO that impeded transport of corroding gas species.

The electrical stability of an AgNW-based transparent electrode is another important aspect of their overall robustness, particularly for transparent heater applications where DC voltage is applied to induce high temperature by Joule heating. Especially, it is of interest to delay and mitigate the abrupt failure experienced by AgNW-based networks above a certain voltage, which has been well-documented in prior studies. Therefore, in order to fully evaluate the stability and reliability of the disclosed composite EPD-GO/AgNW/GO electrode, the resistance was measured in situ while a linear voltage ramp (0.5 V/min) was being applied.

Figure 9:
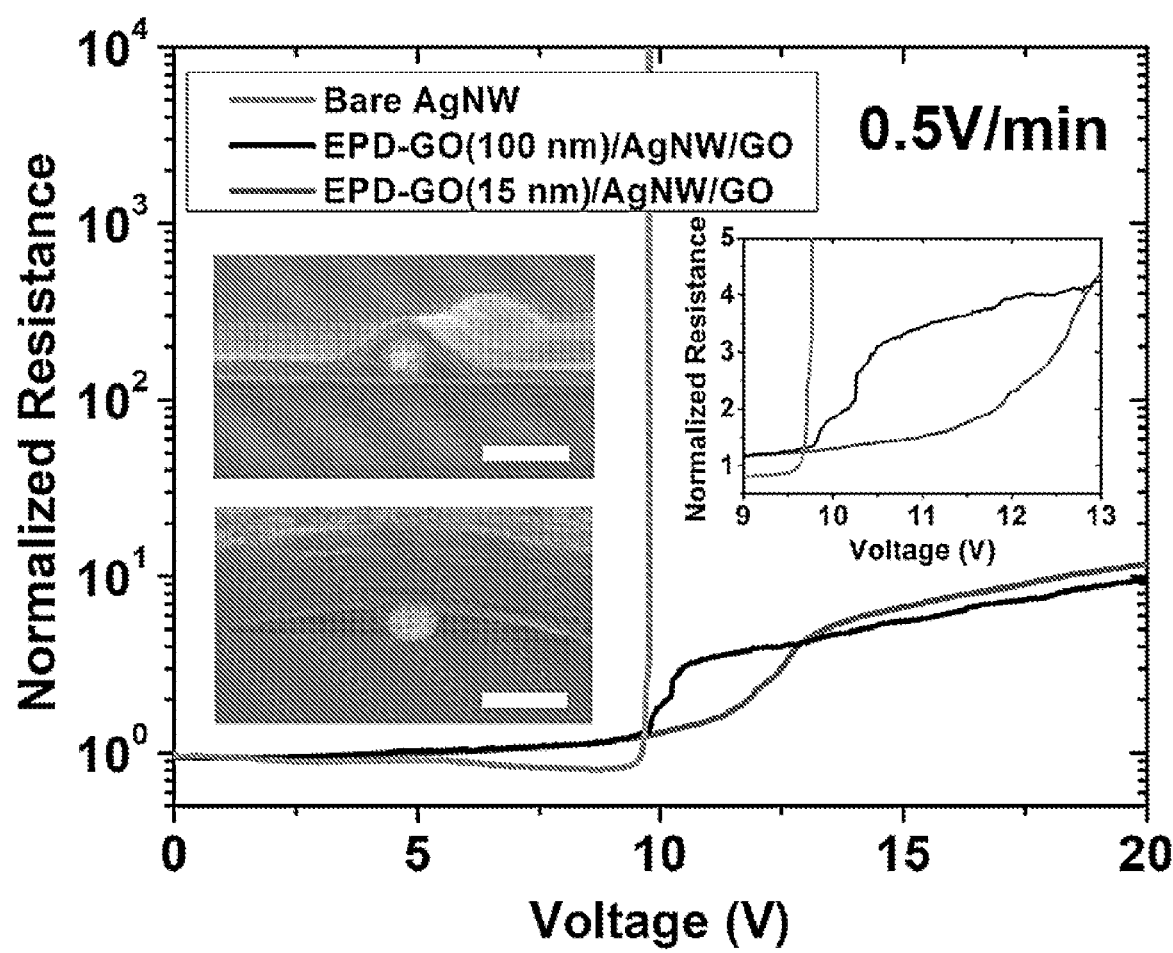
FIG. 9 is a graph of normalized resistance versus voltage for bare AgNW and electrophoretic deposited graphene oxide.

FIG. 9 shows that the uncoated AgNW networks' normalized resistance reduces slightly with voltage up to 5 V, followed by a steeper reduction until 9.5 V, and finally diverges to more than $\sim 10^5$ times its original resistance over the course of only ~20 seconds. The reduction of resistance can be attributed to NW junction optimization occurring due to Joule heating. However, a more intense Joule heating at higher applied voltages will lead to the catastrophic failure caused by the spheroidization of NWs due to Rayleigh instability. Without wishing to be bound by theory, the resistance divergence is believed to be associated with a local defect or inhomogeneity in the current distribution in the NW network. This inhomogeneity in the electrical network is likely to become a hot-spot due to higher local Joule heating, leading to an early spheroidization process in the surrounding area. Then the remaining current will detour to conductive paths above or below the initial hotspot and increase the local current density, leading to another Joule heating-induced failure in the adjacent areas. The iteration of this sequence results in a propagation of the hot-spot along the entire width of the NW network. The NW network is left with an 'electrical crack' region along the trace of the hot-spot, composed of spheroidized NWs. This 'crack' acts as an insulating region in the NW network that causes the measured resistance to diverge.

With EPD-GO/AgNW/GO samples, a different behavior was observed where abrupt divergence of the resistance was prevented. FIG. 9 shows that at the initial stages of ramping, resistance of EPD-GO/AgNW/GO linearly increases, corresponding to the intrinsic resistivity increase of AgNWs by electron-phonon scattering. Unlike bare AgNW, resistance does not decrease for EPD-GO/AgNW/GO. This is further indication that the NW junctions are well-optimized by GO encapsulation, mitigating the need for thermal treatment to further weld the nanowires. An interesting behavior was observed as the voltage was ramped past 9.75 V where rapid increase in resistance to more than $10^5$ times as its original value was prevented. Especially, it was observed that the failure behavior depended on the thickness of EPD-GO layer covering the NW network. The inset of FIG. 9 shows a close-up of the main plot in the range 9~13 V. For 100 nm thick EPD-GO, the resistance deviates from the original linear dependence from ~9.75 V onwards, increasing to 3 times its initial value at ~10.5V over the course of ~90 seconds. Interestingly, for 15 nm thick EPD-GO, initial deviation from the linear behavior occurs at a slightly higher voltage around ~11 V, and increases to 4 times its initial value at ~13 V over the course of ~240 seconds. Therefore, it was observed that thinner EPD-GO coating resulted in a more delayed, as well as a more gradual failure behavior. After this initial damage, both EPD-GO/AgNW/GO samples underwent slower increases in resistance up to 20 V. Even at 20 V, the electrodes exhibited a fairly low resistance near $\sim 150 \Omega$, a ten-fold increase from its original resistance.

Example 2: Chemical Stability with High Humidity

Figure 10:
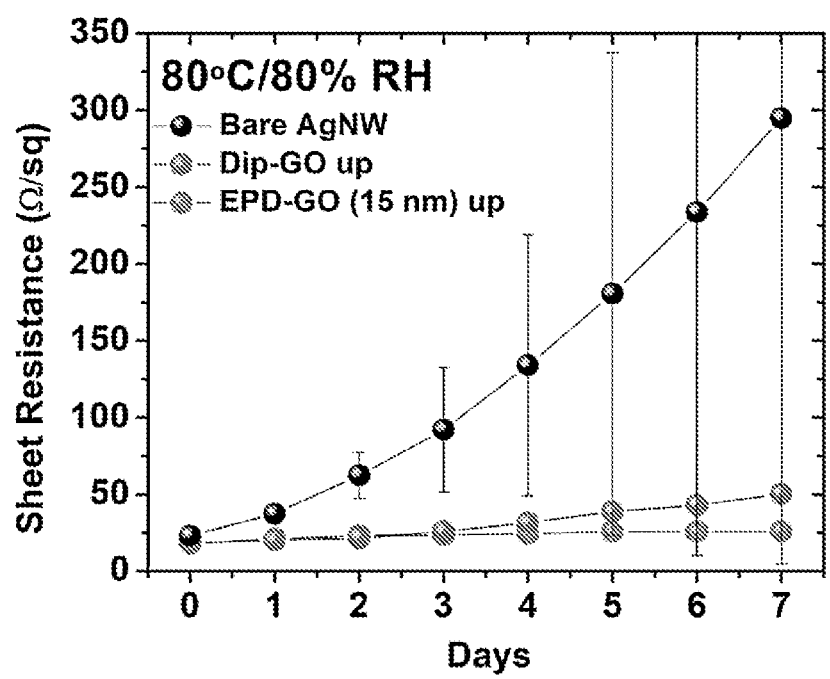
FIG. 10 is a graph of sheet resistance variation versus time for bare AgNW and the disclosed composite electrodes where either graphene oxide or electrophoretic deposited graphene oxide was facing up for samples stored at 80° C. for 7 days with 80% relative humidity.

An EPD-GO/AgNW/GO film with a 15 nm EPD layer and a Dip-GO/AgNW/GO film were prepared and placed in a humidity chamber. As a comparative example, a bare AgNW film was prepared and placed under similar conditions. These networks were stored at 80° C. with a relative humidity (RH) of 80% for 7 days. During this time, the sheet resistance of the films was monitored, and this is reported in FIG. 10. As in Example 1, the sheet resistance of the bare AgNW film increased substantially, by a factor of 12. The sheet resistance of the 15 nm EPD-GO/AgNW/GO film only increased by a factor of 1.4. The Dip-GO/AgNW/GO film experienced an intermediate increase in sheet resistance—a factor of 2.4. These results further support that under high humidity conditions, GO impedes penetration of sulfuric gas species through AgNWs.

Example 3: Junction Height in AgNW Networks

An EPD-GO/AgNW/GO film was prepared for AFM analysis using the methods described above. As a comparative example, a bare AgNW film was also prepared for AFM analysis. As demonstrated in Example 1, bare AgNW films exhibit a high mean sheet resistance with a large standard deviation, indicating that the resistance between wires is not only high but is also widely varying. In contrast, EPD-GO/AgNW/GO films annealed at 200° C. for 50 minutes showed a sharp reduction of sheet resistance and a reduced standard deviation, indicating greater homogeneity of NW junctions.

Figure 11B:
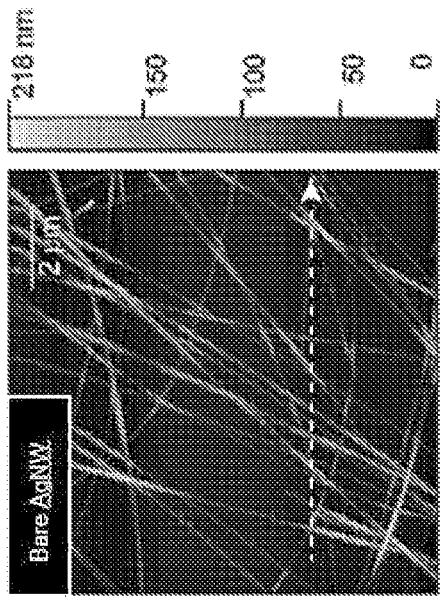
FIGS. 11B-11C are raw atomic force microscope images of a bare AgNW film and a EPD-GO/AgNW/GO film, respectively.
Figure 11C:
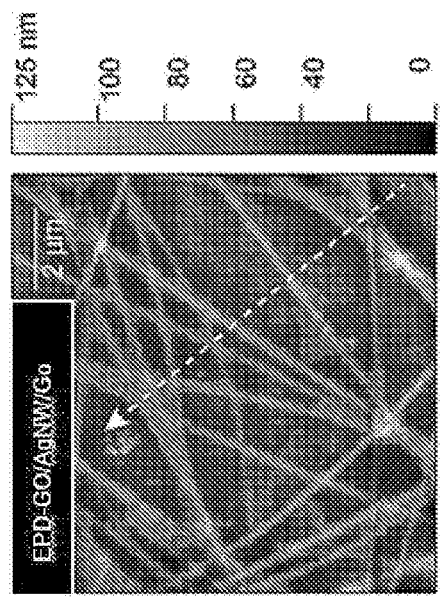
Figure 11A:
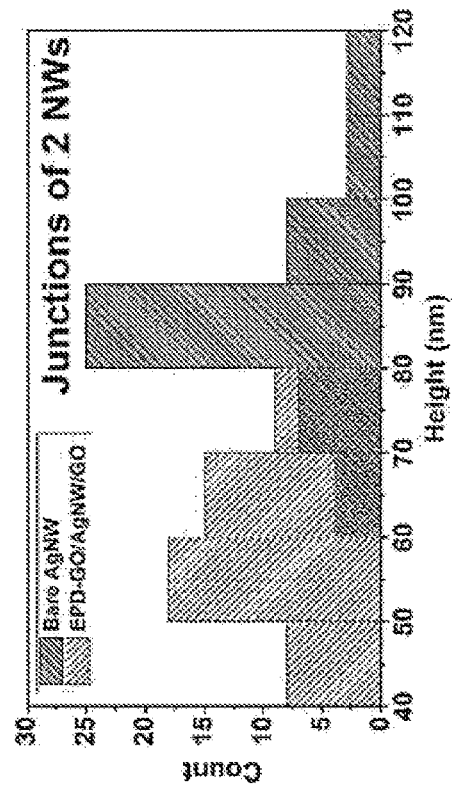
FIG. 11A is a histogram contrasting the relative height of a bare AgNW film and a EPD-GO/AgNW/GO film determined by atomic force microscopy.
Figure 11D:
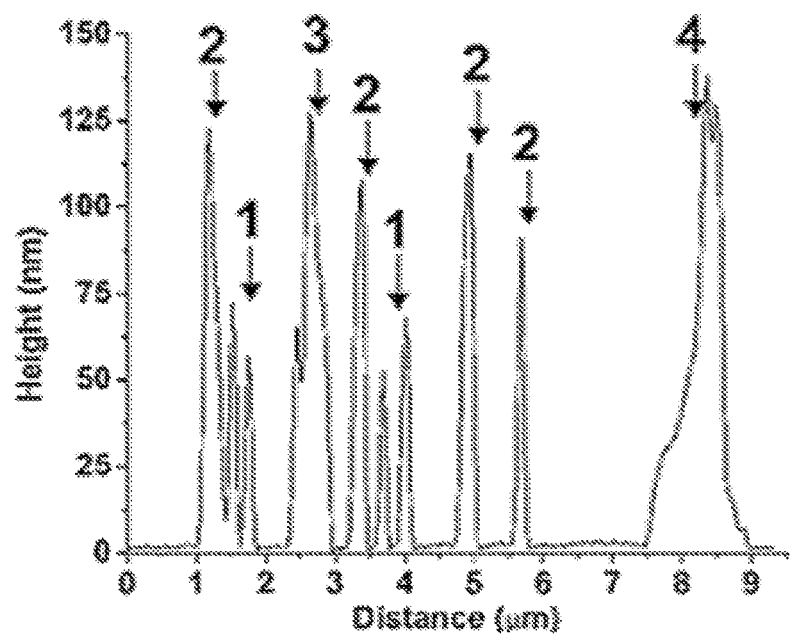
FIGS. 11D-11E are cross-sections of the atomic force microscope images presented in FIGS. 11B-11C, respectively, with peak labels indicating the number of AgNWs believed to overlap in a given position.
Figure 11E:
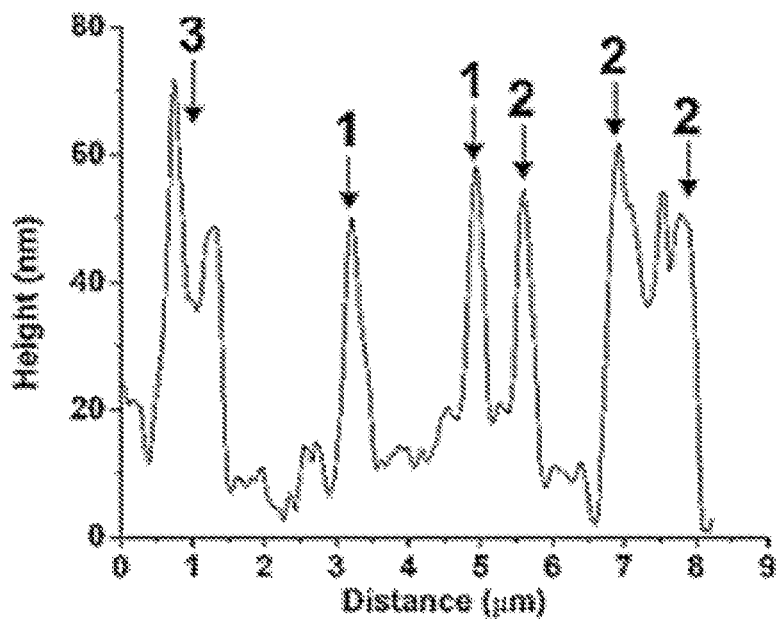

By AFM analysis, the height of NW junctions was compared in the bare AgNW film and the EPD-GO/AgNW/GO film. FIG. 11A presents height histograms for both films, demonstrating much less height variation in the EPD-GO/AgNW/GO film. FIGS. 11B-C present raw AFM images for the bare AgNW film and the EPD-GO/AgNW/GO film, respectively. FIGS. 11D-E present cross-sections of the data presented in FIGS. 11B-C, respectively, along the paths indicated by the dashed arrows. In FIGS. 11D-E, the numerical peak-labels indicate the number of NWs intersecting at that point. As these results clearly demonstrate, the EPD-GO/AgNW/GO film exhibits substantially greater uniformity than the bare AgNW film, helping to explain the reduction in sheet resistance reported in Example 1. Without wishing to be bound by theory, this is believed to result from the downward forces associated with drying of the GO layers.

Example 4: Film Transfer to Curved Surfaces

Two EPD-GO/AgNW/GO films were prepared using an 0.08 mg/mL GO solution. One of these films was transferred to a planar glass surface. The other was transferred to a curved surface of a 15 mL glass vial. This example illustrates that EPD-GO/AgNW/GO films can be transferred to curved surfaces as well as planar ones.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

What is claimed is:

1. An electrode comprising:
   a first layer comprising first particles, wherein the first layer is substantially continuous;
   a second layer comprising conductive nanowires; and
   a third layer comprising second particles, wherein the second layer is disposed between and in electrical contact with the first layer and the third layer;
   wherein an average sheet resistance of the electrode is between or equal to 5 $\Omega$/sq and 100 $\Omega$/sq.

2. The electrode of claim 1, wherein the second layer is substantially continuous.

3. The electrode of claim 2 wherein the first layer and the second layer are substantially co-extensive.

4. The electrode of claim 1, wherein the first particles and the second particles comprise at least one selected from the group of particles of atomically thin material, metal oxide particles, and metal nanoparticles functionalized with charged ligands.

5. The electrode of claim 1, wherein the first particles and the second particles comprise graphene oxide particles and the conductive nanowires comprise silver nanowires.

6. The electrode of claim 1, wherein a transparency of the electrode is greater than 50% for at least one wavelength of light between 350 nm and 700 nm.

7. The electrode of claim 1, wherein the first layer has a thickness between or equal to about 15 nm and 100 nm, and wherein the thickness of the first layer exceeds a thickness of the second layer and a thickness of the third layer.

8. The electrode of claim 1, wherein the first particles are the same as the second particles.

9. The electrode of claim 1, wherein the conductive nanowires have a maximum longitudinal dimension that is greater than or equal to 100 times a maximum lateral dimension.

10. A method of forming an electrode, the method comprising:
    depositing a first layer comprising first particles, wherein the first layer is substantially continuous;
    depositing a second layer comprising conductive nanowires on the first layer; and
    depositing a third layer comprising second particles on the second layer;
    wherein an average sheet resistance of the electrode is between or equal to 5 $\Omega$/sq and 100 $\Omega$/sq.

11. The method of claim 10, wherein depositing the first layer includes electrophoretically depositing the first layer on a substrate.

12. The method of claim 11, further comprising depositing a release layer on the substrate prior to depositing the first layer on the substrate.

13. The method of claim 12, wherein the release layer comprises a polymer.

14. The method of claim 10, wherein depositing the third layer includes dip coating the second layer in a solution including the second particles.

15. The method of claim 10, further comprising releasing the first layer from a first substrate the first layer is deposited on.

16. The method of claim 10, further comprising transferring the electrode including the first, second, and third layers onto a second substrate with the first layer disposed on the substrate and the third layer oriented away from the substrate.

17. The method of claim 10, wherein the second layer is substantially continuous.

18. The method of claim 17 wherein the first layer and the second layer are substantially co-extensive.

19. The method of claim 10, wherein the first particles and the second particles comprise at least one selected from the group of particles of atomically thin material, metal oxide particles, and metal nanoparticles functionalized with charged ligands.

20. The method of claim 10, wherein the first material and the second material comprise graphene oxide particles, and the conductive nanowires comprise silver nanowires.

21. The method of claim 10, wherein a transparency of the electrode is greater than 50% for at least one wavelength of light between 350 nm and 700 nm.

22. The method of claim 10, wherein the first layer has a thickness between or equal to about 15 nm and 100 nm, and wherein the thickness of the first layer exceeds a thickness of the second layer and a thickness of the third layer.

23. The method of claim 10, wherein the first particles are identical to the second particles.

24. The method of claim 10, wherein the conductive nanowires have a maximum longitudinal dimension that is greater than or equal to 100 times a maximum lateral dimension.

25. The method of claim 10, wherein a processing temperature remains below 100° C.

26. An electrode comprising:
    a first layer comprising first particles, wherein the first layer is substantially continuous;
    a second layer comprising conductive nanowires; and
    a third layer comprising second particles, wherein the second layer is disposed between and in electrical contact with the first layer and the third layer;
    wherein the first layer has a thickness between or equal to about 15 nm and 100 nm, and wherein the thickness of the first layer exceeds a thickness of the second layer and a thickness of the third layer.

* * * * *